(12) United States Patent
Kim et al.

(10) Patent No.: US 9,165,637 B2
(45) Date of Patent: Oct. 20, 2015

(54) VOLATILE MEMORY DEVICE AND A MEMORY CONTROLLER

(71) Applicants: Sang-Yun Kim, Hwaseong-Si (KR); Jong-Pil Son, Seongnam-si (KR); Su-A Kim, Seongnam-si (KR); Chul-Woo Park, Yongin-si (KR); Hong-Sun Hwang, Suwon-si (KR)

(72) Inventors: Sang-Yun Kim, Hwaseong-Si (KR); Jong-Pil Son, Seongnam-si (KR); Su-A Kim, Seongnam-si (KR); Chul-Woo Park, Yongin-si (KR); Hong-Sun Hwang, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 301 days.

(21) Appl. No.: 13/720,998

(22) Filed: Dec. 19, 2012

(65) Prior Publication Data

US 2013/0282973 A1 Oct. 24, 2013

(30) Foreign Application Priority Data

Apr. 24, 2012 (KR) ........................ 10-2012-0042411

(51) Int. Cl.
*G11C 29/00* (2006.01)
*G11C 11/406* (2006.01)

(52) U.S. Cl.
CPC .... *G11C 11/40622* (2013.01); *G11C 11/40611* (2013.01); *G11C 11/40618* (2013.01); *G11C 2211/4061* (2013.01)

(58) Field of Classification Search
CPC .. G11C 29/04; G11C 29/50016; G11C 29/08; G11C 29/783
See application file for complete search history.

(56) References Cited

U.S. PATENT DOCUMENTS

| 5,909,404 | A | 6/1999 | Schwarz |
|---|---|---|---|
| 6,058,069 | A | 5/2000 | Ting et al. |
| 7,095,669 | B2 * | 8/2006 | Oh ................................ 365/222 |
| 7,269,085 | B2 * | 9/2007 | Sohn et al. .................... 365/222 |
| 7,283,395 | B2 * | 10/2007 | Ziegelmayer ............ 365/185.19 |
| 7,345,941 | B2 * | 3/2008 | Matsui ........................... 365/222 |
| 2001/0024382 | A1 | 9/2001 | Shimoyama et al. |
| 2006/0104144 | A1 | 5/2006 | Byeon et al. |
| 2007/0033338 | A1 * | 2/2007 | Tsern ............................ 711/106 |
| 2009/0024884 | A1 | 1/2009 | Klein |
| 2010/0208537 | A1 * | 8/2010 | Pelley et al. .................. 365/201 |
| 2010/0271891 | A1 * | 10/2010 | Dell et al. ..................... 365/200 |
| 2011/0283060 | A1 * | 11/2011 | Ware et al. .................... 711/106 |

* cited by examiner

*Primary Examiner* — Aimee Li
*Assistant Examiner* — Edmund Kwong
(74) *Attorney, Agent, or Firm* — Muir Patent Law, PLLC

(57) ABSTRACT

A method of operating a volatile memory device includes storing address information of weak cell rows. According to some examples, after writing to a weak cell row, a refresh operation is performed on the weak cell row within a predetermined time. According to some examples, the writing operation to a weak cell row may be performed with a longer write recovery time than a write recovery time to normal cell rows.

21 Claims, 25 Drawing Sheets

VOLATILE MEMORY DEVICE AND A MEMORY CONTROLLER

CROSS-REFERENCE TO RELATED APPLICATION(S)

This application claims priority under 35 USC §119 to Korean Patent Application No. 2012-0042411, filed on Apr. 24, 2012, in the Korean Intellectual Property Office (KIPO), the contents of which are incorporated herein in its entirety by reference.

BACKGROUND

1. Technical Field

Exemplary embodiments relate to volatile memory devices, and more particularly to methods of operating volatile memory devices, volatile memory devices and methods of controlling memory systems.

2. Discussion of the Related Art

Recently, as operating speeds of volatile memory (e.g., DRAM) increases, a word line may be deactivated in response to a precharge command before data is sufficiently stored in a memory cell array. In addition, as fabrication process of the DRAM becomes finer, increased resistance in a write path may complicate the writing of data in the memory cell array.

SUMMARY

Some example embodiments provide a method of operating a volatile memory device capable of enhancing write performance.

Some example embodiments provide a volatile memory device capable of enhancing write performance.

Some example embodiments provide a method of controlling a memory system capable of enhancing write performance.

Methods of operating a memory device having an array of memory cells, may comprise writing data to first memory cells of the array of memory cells having a first address; determining if the first address is one of a group of predetermined addresses; and in response to the determining, adjusting a refresh sequence to include a refresh operation to include a first refresh operation for the first memory cells having the first address.

The adjusting step may comprise determining if a sequence of refresh operations for a set of memory cell groups to be refreshed within the first time period includes the first memory cells; and modifying the sequence of refresh operations to include a refresh operation for the first memory cells when it is determined that the set of memory cell groups does not include the first memory cells.

The first memory cells may be memory cells of a first row of the memory cell array, and the adjusting step may comprise determining if a sequence of refresh operations for kth to (k+i)th memory cell rows to be refreshed within the first time period includes the first row; and modifying the sequence of refresh operations to include a refresh operation for the first row when it is determined that the first row is not included in the kth to (k+i)th memory cell rows, wherein k and i are integers.

The kth to (k+i)th memory cell rows may have sequential row addresses.

Methods may also comprise internally generating a sequence of refresh addresses, and the modifying the sequence of refresh operations may comprise inserting the first address into the sequence of refresh addresses.

Methods may also comprise performing a refresh operation every third time period of memory cells identified by an address of the sequence of refresh addresses.

The modifying the sequence of refresh addresses may include inserting the first address into the sequence of refresh addresses such that at least two refresh operations are performed within the third time period.

The adjusting step may comprise adjusting the refresh sequence to include the first refresh operation for the first memory cells having the first address within a first time period and method may also comprise periodically refreshing at least a majority of the memory cells of the array with a refresh period greater than the first time period.

The periodically refreshing step may comprise, after the first refresh operation, refreshing the first memory cells having the first address with the refresh period greater than the first time period.

The adjusting step may comprise adjusting the refresh sequence to include the refresh operation for the first memory cells having the first address within a first time and the method may comprise performing a second refresh operation for the first memory cells having the first address after a second time from performing the first refresh operation. The first time may be less than the second time and no refresh operations may be performed for the first memory cells between the first refresh operation and the second refresh operation.

Methods of operating a memory device having an array of memory cells, may comprise writing data to first memory cells of the array of memory cells having a first address; determining if the first address is one of a group of predetermined addresses; determining if a refresh operation of the first memory cells has occurred within a predetermined time after writing data to the first memory cells; and scheduling a refresh operation of the first memory cells in response to determining that a refresh operation has not occurred within a predetermined time.

The step of scheduling may comprise scheduling a refresh operation on the first memory cells as the next refresh operation performed by the memory device.

The step of scheduling may assure a refresh sequence includes a refresh operation for the first memory cells having the first address within the predetermined time from the writing, the predetermined time being less than a second time period; and the methods may further comprise refreshing at least a majority of the memory cells of the array with a refresh period equal to or greater than the second time period.

Methods of operating a memory device having an array of memory cells may comprise determining if a first address is one of a group of predetermined addresses; writing data to first memory cells of the array of memory cells having the first address with a first time window in response to the determining step; and writing data to second memory cells of the array of memory cells with a second time, the second write recovery time being less than the first write recovery time. The first and second time windows may respectively depend on first and second write recovery times.

The methods may further comprise receiving from the memory device, the group of predetermined addresses.

The group of predetermined addresses may be received by a memory controller during a power up sequence of the memory device.

Methods of operating a memory device may comprise comparing write addresses to a table of weak row addresses, the weak row addresses identifying rows of the memory device having at least one weak cell; modifying a refresh sequence in response to the comparing; wherein, the number of weak row addresses is at least 10% of the number of row addresses in the memory device.

Memory devices may comprise a memory cell array, including a plurality of rows of volatile memory cells, the plurality of rows including weak cell rows and normal cell rows; a command decoder configured to receive commands from a source external to the memory device; an address table storing a plurality of weak cell row addresses identifying corresponding weak cell rows; a refresh control circuit configured to control operation of the memory cell array to periodically refresh the plurality of rows of volatile memory cells, wherein the refresh control circuit is configured to cause a refresh operation of the weak cell row in response to the command decoder receiving a write command to write to a weak cell row identified by a weak cell row address stored in the address table.

The refresh control circuit may be configured to monitor a sequence of refresh operations during a first time period after receiving the write command to write to the weak cell row.

The refresh control circuit may be configured to add a refresh operation to the sequence of refresh operations upon a determination that the weak cell row has not been refreshed within a first period of time.

The refresh control circuit may be configured to refresh normal cell rows with a refresh period of a second period of time, the second period of time being greater than the first period of time.

The refresh control circuit may be configured to replace a scheduled refresh operation of a first row with a refresh operation of the weak cell row.

The refresh control circuit may be configured to cause a refresh operation of the first row immediately after the refresh operation of the weak cell row.

The refresh control circuit may be configured to cause a refresh operation of the weak cell row to occur at the same time as the refresh operation of a first row.

The refresh control circuit may be configured to analyze a refresh schedule to determine if the refresh schedule includes a refresh operation of the weak cell row within predetermined time.

Memory devices may comprise a memory cell array, including a plurality of rows of volatile memory cells, the plurality of rows including weak cell rows and normal cell rows; a command decoder configured to receive commands from a source external to the memory device; and a row decoder configured to perform a first write operation to a weak cell row with a first time window and to perform a second write operation to a normal cell row with a second time window, the second time window being less than the first time window. The first time window and the second time window may respectively correspond to a first write recovery time and a second recovery time.

The command decoder may be configured to receive a first write command to indicate the first write operation with the first time window and to receive a second write command to indicate the second write operation.

The first write command and the second write command may include different command codes.

The command decoder may be configured to receive with each of the first and second write commands, a respective address identifying a row to be written to and a respective code identifying a write time to be used in writing to the identified row.

The memory cell array may further comprise an address table storing a plurality of weak cell row addresses identifying corresponding weak cell rows.

The memory device may be configured to transmit the weak cell row addresses to the memory controller.

The command decoder may be configured to receive with each of the first and second write commands, a respective address identifying a row to be written to, wherein the memory device further comprises a control circuit configured to select the first time window in response to determining the address received with the first write command corresponds to a weak cell row address stored in the address table.

The control circuit may be configured to select the second time window in response to determining the address received with the second write command does not correspond to any weak cell row address stored in the address table.

Memory controllers may comprise a control circuit configured to generate commands to be sent to a memory device, the commands including a write command and a refresh command; a table storing a plurality of weak cell row addresses of the memory device; an address comparing unit configured to determine if a first address associated with a first write command to be sent to the memory device corresponds to one of the plurality of weak cell row addresses; wherein the control circuit is responsive to the address comparing unit to schedule a refresh command associated with the first address in response to the determination of the address comparing unit.

The memory controller may be configured to receive the plurality of weak cell row addresses from the memory device and to store the received plurality of weak cell row addresses in the table.

The control circuit may be configured to generate a first refresh command to refresh a first cell row corresponding to the first address and the first cell row may be refreshed within a first time period after a write operation to the first cell row.

The control circuit may be configured to generate at least one second refresh command to refresh second cell rows within a second time period, the second time period being greater than the first time period.

The controller may be responsive to the address comparing unit to generate a first write command for a weak cell row address stored in the table and a second write command for a normal cell row not identified by the table.

The first write command causes the memory device to perform a write operation for a first time period, and the second write command causes the memory device to perform a write operation for a second time period, the second time period being less than the first time period.

A command code of the first write command may be different from a command code of the second write command.

The control circuit may be configured to generate the first write command with a first time indicator and to generate the second write command with a second time indicator, wherein the memory device is responsive to the first and second time indicators to respectively cause write operations for the first time period and the second time period.

Memory controllers may comprise a control circuit configured to generate commands to be sent to a memory device, the commands including a write command and a refresh command; a table storing a plurality of weak cell row addresses of the memory device; an address comparing unit configured to determine if a first address associated with a first write command to be sent to the memory device corresponds to one of the plurality of weak cell row addresses; wherein the control circuit is responsive to the address comparing unit to generate a first write command for a weak cell row address stored in the table and a second write command for a normal cell row not identified by the table.

The first write command may cause the memory device to perform a write operation for a first time period, and the second write command causes the memory device to perform a write operation for a second time period, the second time period being less than the first time period.

Memory systems may include one or more of the memory devices and/or one or more of the memory controllers described herein. Memory devices, memory controllers and/or memory systems may implement one or more of the methods described herein. Methods may include operations of the devices, controllers and/or systems described herein.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION OF THE EMBODIMENTS

Figure 1:
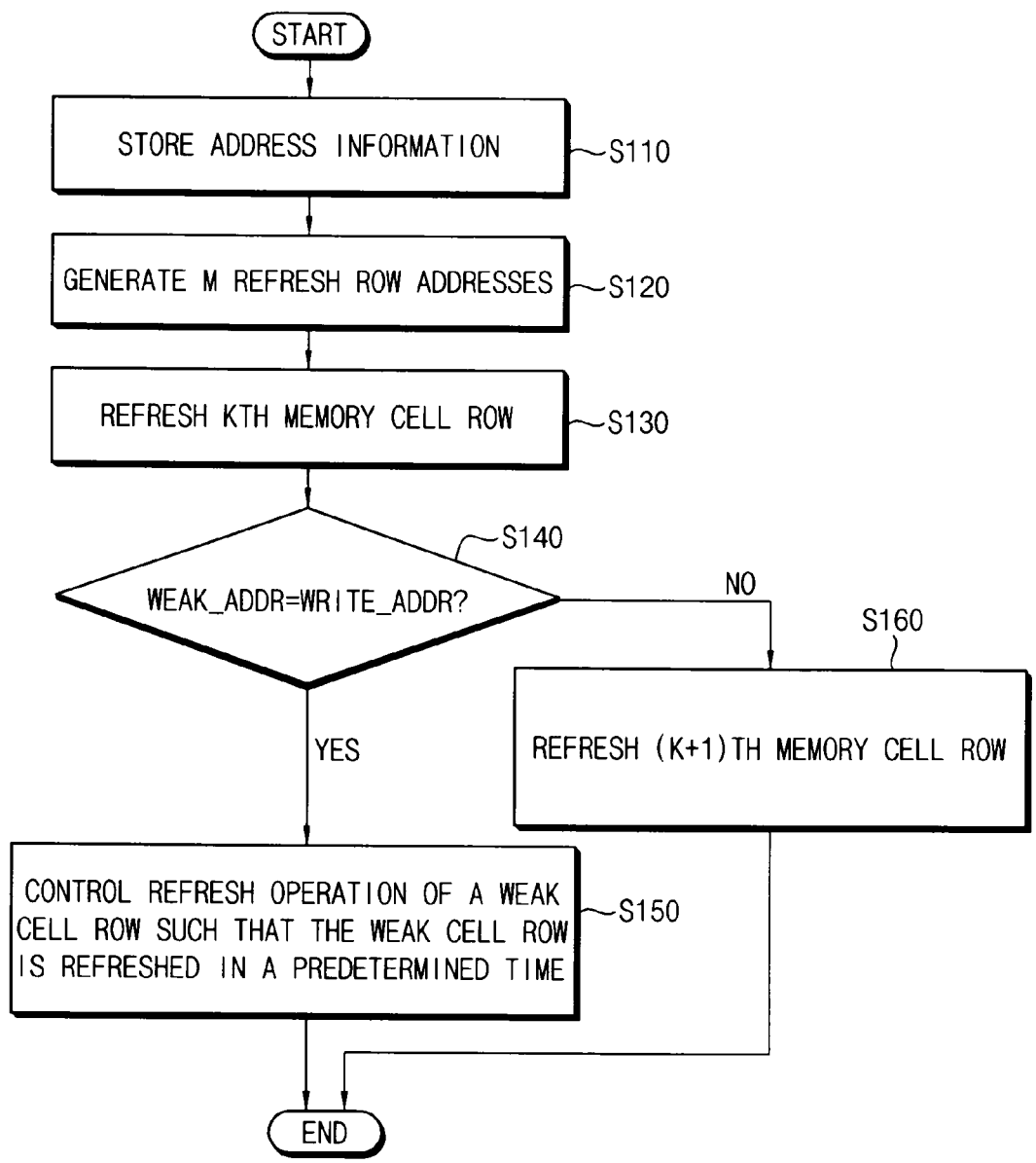
FIG. 1 is a flow chart illustrating a method of operating a volatile memory device according to some exemplary embodiments.

Various exemplary embodiments will be described more fully hereinafter with reference to the accompanying drawings, in which some exemplary embodiments are shown. The present invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of operating a volatile memory device according to some exemplary embodiments.

Referring to FIG. 1, address information is stored (S110). The address information may be stored before or after the volatile memory device is packaged. The memory device may be a semiconductor memory chip, for example. The address information may include one or more weak cell addresses identifying weak memory cells, such as one or more weak cell row addresses WEAK_ADDR each identifying a row of memory cells including one or more weak memory cells. A weak cell may be a memory cell whose write performance is worse than normal memory cells. M refresh row addresses are generated (S120). The M refresh addresses may be generated prior to initiation of a refresh operation of the memory cells associated with the M refresh addresses. Alternatively, the M refresh addresses may be generated during the initiation of the refresh operation of the memory cells associated with the M refresh addresses (e.g., by an address counter). Generation of refresh row addresses may initiate a refresh operation for memory cells selected by the corresponding row address(es) of the volatile memory device. For example, after a power-up sequence is completed the refresh operation may be initiated. In some embodiments, the refresh operation may be an auto refresh operation in which the memory device automatically generates a sequence of refresh row addresses in response to a periodically applied refresh command (REF) received from a memory controller and refreshes a memory cell row corresponding to the internally generated refresh row addresses. In other embodiments, the refresh operation may be a self refresh operation that periodically refreshes memory cell rows using a built-in timer in a self refresh mode into which the volatile memory device enters in response to a self refresh entry command (SRE). In some embodiments, the refresh operation may employ a distributed refresh scheme in which refresh cycles are distributed such that the refresh cycles are evenly spaced at predetermined periodic refresh intervals (tREFI). In other embodiments, the refresh operation may employ a burst refresh scheme in which a series of refresh cycles are consecutively performed. The refresh row addresses may be provided to the memory by a memory controller.

A kth memory cell row corresponding to kth refresh row address of the M refresh addresses generated in step S120 is refreshed (S130), where k is a natural number. During the refresh operation of the memory cell rows of the M refresh addresses, a write operation to a row of memory cells may occur. For example, a write command to a particular row of memory cells may be received from an external source, such as from a memory controller. The write row address for writing data in one of the memory cell rows is compared with the weak cell row address (S140).

When the write row address WRITE_ADDR does not match with any weak cell row address WEAK_ADDR (NO in S140), the next memory cell row of the M refresh addresses is refreshed. Step S160 shows the (k+1)th memory cell row corresponding (k+1)th refresh row address is refreshed. When the write row address WRITE_ADDR matches with a weak cell row address WEAK_ADDR (YES in S140), a refresh operation of the weak cell row corresponding to the matching weak cell row address WEAK_ADDR is controlled such that the corresponding weak cell row is refreshed within a predetermined time of the write operation to the corresponding weak cell row. The predetermined time may be selected previously, such as during testing of the volatile memory device. The predetermined time may be selected to avoid loss of the data written in the corresponding weak cell row, allowing for the refresh operation to restore storage characteristics of the memory cells of the corresponding weak row (for example, to restore charges in a memory cell capacitors in a DRAM weak cell row). The predetermined time may be individually selected for each weak cell row, or may be a single predetermined time for all identified weak cell rows, or may be selected from several predetermined times, one predetermined time for one of several groups of identified weak cell rows. In this embodiment and other embodiments described herein, the predetermined time may be less than a second time period used as a refresh interval for normal cell rows. For example, normal cell rows may be scheduled to be refreshed every time interval $t_{normal}$, and the predetermined time may be less than $t_{normal}$. The normal cell rows may constitute a majority of the memory cell rows of the memory device. In some examples, weak cell rows may also be periodically refreshed with a time interval $t_{normal}$ used for normal cell rows after being refreshed within the predetermined time period (e.g., less than $t_{normal}$) during routine refresh operations of the memory device. In other embodiments, the weak cell rows may continue to be periodically refreshed with a refresh interval of their respective predetermined time(s) (e.g., less than $t_{normal}$). Various operations such as write operations or read operations may be performed between the steps of the method of FIG. 1. Step S150 may include refreshing the (k+1)th memory cell row during the same refresh period as the weak cell row (either in sequential order, or simultaneously if supported—e.g., when the weak memory cell row and the (k+1)th memory cell row are in different banks of the volatile memory device that may perform operations in parallel). Alternatively, the refresh operation of the (k+1)th memory cell row may be delayed until the next scheduled refresh period.

The row address of the volatile memory device may include M addresses (which is natural number greater than one) and the M refresh row addresses may be generated by N-bit counter. In addition, a memory cell row may be a row of memory cells connected to the same wordline, and a weak cell row may be a memory cell row including at least one weak cell whose write performance is worse than normal cell. A weak cell row may include both weak cells and normal cells.

Figure 2:
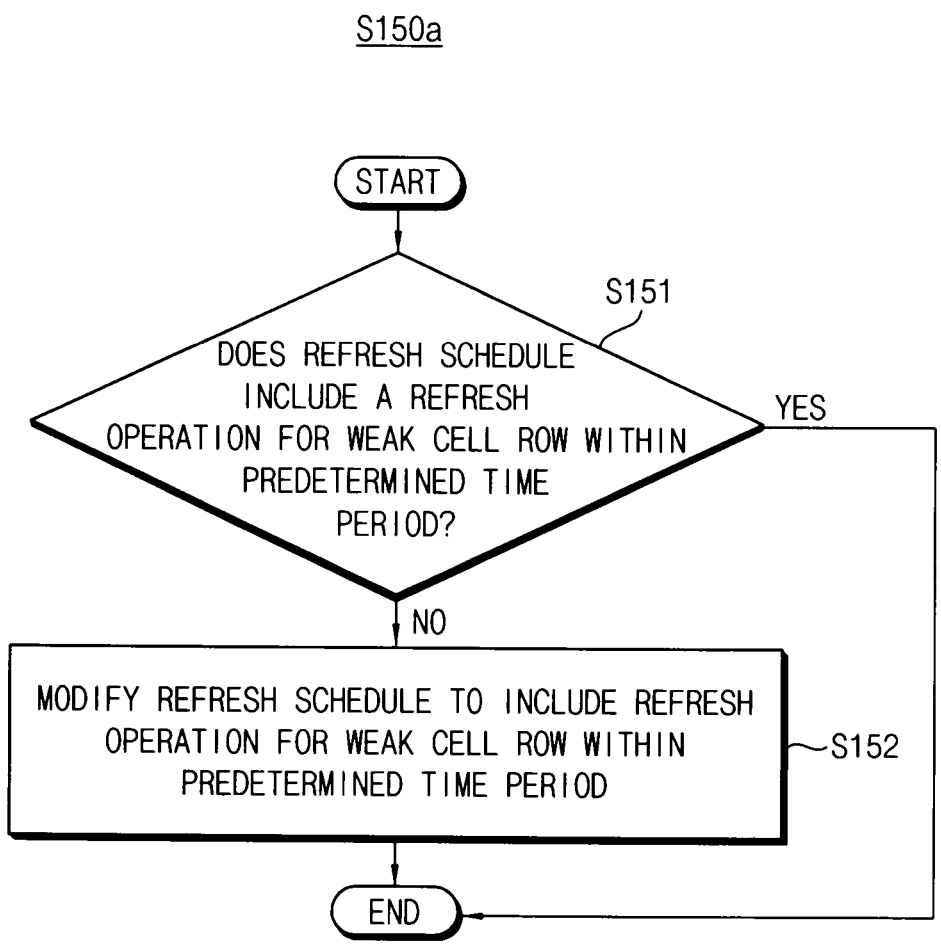
FIG. 2 is a flow chart illustrating a step (S150) in FIG. 1 according to an example embodiment.

FIG. 2 is a flow chart illustrating an exemplary step S150a that may be step (S150) in FIG. 1 according to an example embodiment.

Referring to FIG. 2, after step (S140), a refresh schedule is analyzed to determine if it includes (or will include) a refresh operation for the weak cell row within the predetermined period of time (S151). For example, when refreshing memory cell rows in sequential order (by address), the weak cell row address may be compared with the refresh row address REF_ADDR and REF_ADDR+X to determine if it falls within the range of REF_ADDR and REF_ADDR+X, where REF_ADDR is the currently scheduled row for a refresh operation, and X is a number of memory cell rows that are scheduled for a refresh operation within the predetermined period of time. As another example, a table including a refresh schedule for memory cell rows (whether in sequential or non-sequential order by address) may be examined to determine if the weak cell row is scheduled for a refresh operation within the predetermined period of time. If the refresh schedule includes a refresh operation for the weak cell row within the predetermined period of time (YES in S151), the refresh schedule may be left unchanged and step S150a may be complete (or may be complete upon performing next scheduled refresh operation, such as refreshing the (k+1)th memory cell row). If the refresh schedule does not include a refresh operation for the weak cell row within the predetermined period of time (NO in S151), the refresh schedule may be modified to include a refresh operation for the weak cell row within the predetermined period of time (S152). For example, the refresh operation for the weak cell row address may be added to the table including the refresh schedule. Or, the weak cell row address may be inserted as the next row to be refreshed, and row addresses that otherwise scheduled for refresh may be delayed (e.g., output from a refresh counter may be delayed by one refresh cycle to allow for inserting the weak cell row address as the next row to be refreshed). Step S150a may be complete after step S152 (or may be complete upon performing next scheduled refresh operation, such as refreshing the (k+1)th memory cell row).

Figure 3:
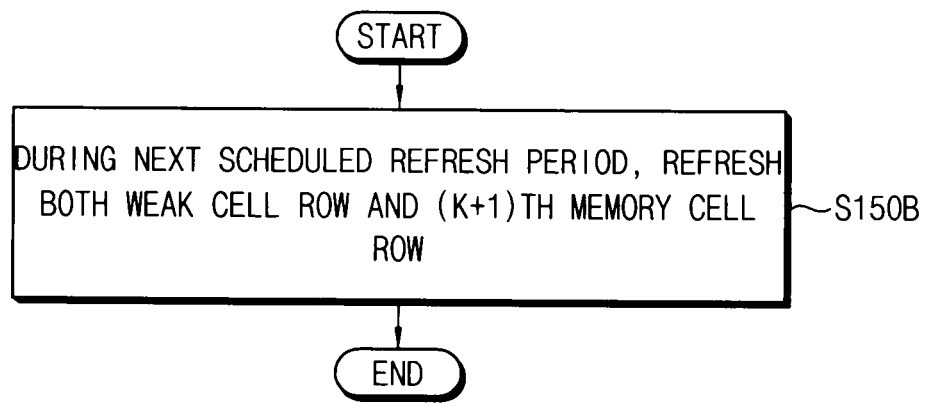
FIG. 3 is a flow chart illustrating a step (S150) in FIG. 1 according to another example embodiment.

FIG. 3 is a flow chart illustrating an exemplary step S150b which may be step (S150) in FIG. 1 according to another example embodiment.

Referring to FIG. 3, the weak cell row address is refreshed during the next scheduled refresh period along with the compared with the previously next-scheduled row corresponding to refresh row address REF_ADDR of the M refresh row addresses. For example, this previously next-scheduled row address may be the (k+1)th memory cell row when refreshing is performed in sequential order. The previously next-scheduled row and the weak cell row may be refreshed sequentially or simultaneously. For example, the weak cell row may be immediately refreshed and the previously next-scheduled row corresponding to refresh row address REF_ADDR may be refreshed after a row cycle time tRC. The row cycle time tRC may be the time corresponding to the number of clock cycles needed to complete a full cycle, which may include precharging and activating a row. As an alternative to step S150b, the method may first determine if the refresh row address REF_ADDR corresponding to the next-scheduled refresh operation and the weak cell row address are the same. If they are the same, then the next refresh operation may be for the weak cell row (and a second refresh operation may be avoided).

Other methods may be implemented to assure that the weak cell row is refreshed in a predetermined time. For example, after the write operation, all refresh operations that occur within a first period of time after the write operation may be monitored. If the weak cell row has not been refreshed during this first time period, either the memory device or controller may cause a refresh operation for the weak cell row to assure the weak cell row is refreshed within the predetermined time. For example, the weak cell row address may be added to a sequence of refresh row addresses as the next refresh address, either at the memory device, or by a memory controller issuing a refresh command to the memory device.

In a method of operating a volatile memory device according to an example embodiment, when the weak cell row address matches with the write address, the weak cell row is refreshed before the data in the weak cell row is lost in the predetermined time.

Figure 4:
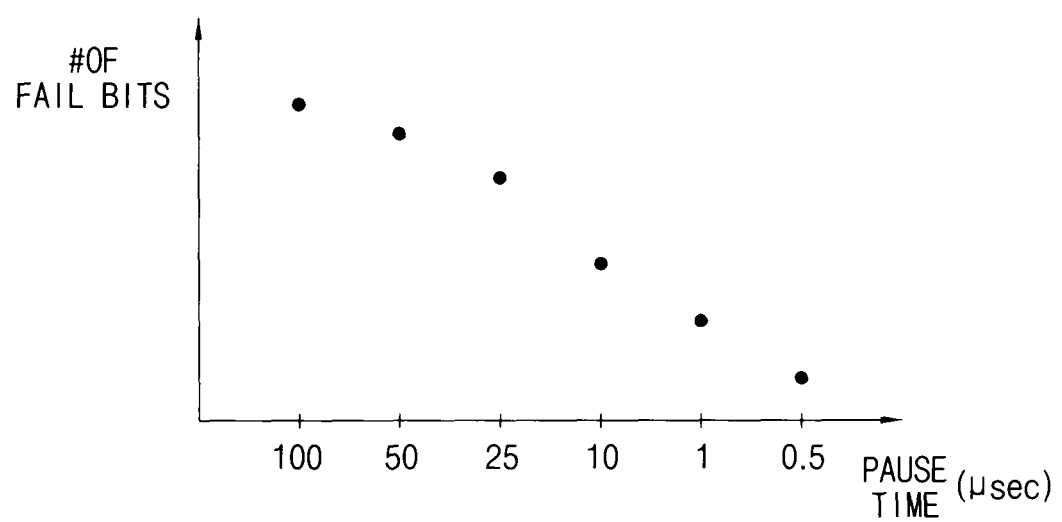
FIG. 4 is a graph illustrating a relationship between a pause time and a number of fail bits.

FIG. 4 is a graph illustrating a relationship between a pause time and a number of fail bits. The pause time is an interval between a time when the data is written and a time when a memory cell row including the write data is refreshed.

Referring to FIG. 4, it is noted that the number of fail bits increases as the pause time increases. In a method of operating a volatile memory device according to an example embodiment, the pause time may be reduced by rewriting the data in the weak cell row by refreshing the weak cell row earlier after the initial writing as compared to a normal cell row. For example, the weak cell row may be refreshed simultaneously (or sequentially) with the next scheduled row to be refreshed (e.g., the (k+1)th row or the row corresponding to REF_ADDR), or the refresh schedule may be modified to schedule a refresh operation of the weak cell row within the predetermined time.

Figure 5:
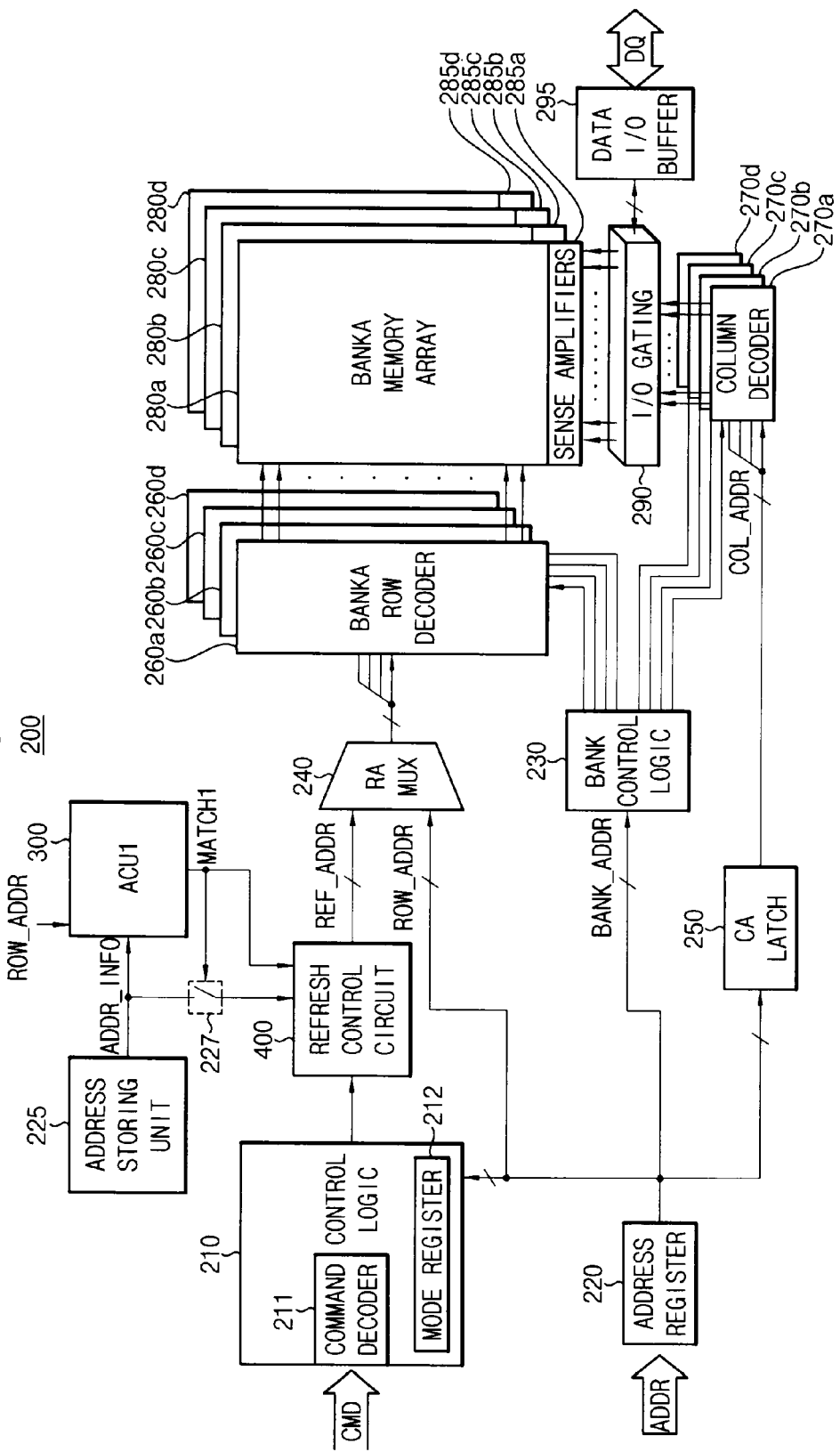
FIG. 5 is a block diagram illustrating a volatile memory device that performs an operation method according to some exemplary embodiments.

FIG. 5 is a block diagram illustrating a volatile memory device that performs an operation method according to some exemplary embodiments.

Referring to FIG. 5, a volatile memory device 200 includes a control logic 210, an address register 220, a bank control logic 230, a row address multiplexer 240, a column address latch 250, a row decoder, a column decoder, a memory cell array, a sense amplifier unit, an input/output gating circuit 290, a data input/output buffer 295, an address storing unit 225, an address comparing unit 300 and a refresh control circuit 400. In some embodiments, the volatile memory device 200 may be a dynamic random access memory (DRAM), such as a double data rate synchronous dynamic random access memory (DDR SDRAM), a low power double data rate synchronous dynamic random access memory (LP-DDR SDRAM), a graphics double data rate synchronous dynamic random access memory (GDDR SDRAM), a Rambus dynamic random access memory (RDRAM), etc., or may be other volatile memory devices that include a refresh operation.

The memory cell array may include first through fourth bank arrays 280a, 280b, 280c and 280d. The row decoder may include first through fourth bank row decoders 260a, 260b, 260c and 260d respectively coupled to the first through fourth bank arrays 280a, 280b, 280c and 280d, the column decoder may include first through fourth bank column decoders 270a, 270b, 270c and 270d respectively coupled to the first through fourth bank arrays 280a, 280b, 280c and 280d, and the sense amplifier unit may include first through fourth bank sense amplifiers 285a, 285b, 385c and 385d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although the volatile memory device 200 is illustrated in FIG. 5 as including four banks, the volatile memory device 200 may include any number of banks.

The address register 220 may receive an address ADDR including a bank address BANK_ADDR, a row address ROW_ADDR and a column address COL_ADDR from a memory controller (not shown). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh row address REF_ADDR from the refresh control circuit 400. The row address multiplexer 240 may selectively output the row address ROW_ADDR or the refresh row address REF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line corresponding to the row address. For example, the activated bank row decoder may apply a word line driving voltage to the word line corresponding to the row address. The word line driving voltage may act to turn on access transistors of memory cells connected to the corresponding word line to allow data of the memory cells to be transferred to bit lines and sensed (e.g., by sense amplifiers). The sensing of the data may also act to restore the data in the memory cells, acting to refresh the data, as is known.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR output from the column address latch 250, and may control the input/output gating circuit 290 to output data corresponding to the column address COL_ADDR.

The input/output gating circuit 290 may include a circuitry for gating input/output data. The input/output gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array, and may be stored in the read data latches. The data DQ stored in the read data latches may be provided to the memory controller via the data input/output buffer 295. Data DQ to be written to one bank array of the first through fourth bank arrays 280a, 280b, 280c and 280d may be provide from the memory controller to the data input/output buffer 295. The data DQ provided to the data input/output buffer 295 may be written to the one array bank via the write drivers.

The control logic 210 may control operations of the volatile memory device 200. For example, the control logic 210 may generate control signals for the volatile memory device 200 to perform a write operation or a read operation. The control logic 210 may include a command decoder 211 that decodes a command CMD received from the memory controller and a mode register 212 that sets an operation mode of the volatile memory device 200. For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may further receive a clock signal (CLK) and a clock enable signal (/CKE) for operating the volatile memory device 200 in a synchronous manner. The control logic 210 may control the refresh control circuit 400 to perform an auto refresh operation in response to a refresh command (REF), or may control the refresh control circuit 400 to perform a self refresh operation in response to a self refresh entry command (SRE).

The address storing unit 225 may include address information ADDR_INFO for at least one weak cell row. The address information ADDR_INFO stored in the address storing unit 225 may be the row addresses of the number of weak cell rows included in a memory cell array. In some embodiments, the address information ADDR_INFO may be stored in the address storing unit 410 before a volatile memory device including the refresh address generator 400 is packaged. In other embodiments, the address information ADDR_INFO may be stored in the address storing unit 410 after the volatile memory device is packaged. In some embodiments, the address storing unit 410 may be implemented with an electrically programmable fuse memory, a laser-programmable fuse memory, an anti-fuse memory, a one-time programmable memory, a flash memory, or other types of nonvolatile memories. The weak cell rows may be determined through testing as part of manufacturing the memory device and/or semiconductor package including the memory device. The number of weak cell rows may be adjustable as a function of determining a minimum data retention time of memory cells to divide the memory cells into weak cells and normal cells (and thus, weak cell rows and normal cell rows). The number of weak cell rows may also be adjustable by replacing very weak cell rows with spare memory cell rows. The number of weak cell rows may be at least 2% of the memory cell rows, at least 10% of the memory cell rows or even at least 20% of the memory cell rows.

The address comparing unit 300 may compare the row address ROW_ADDR received from the address register 220 (connection not shown in FIG. 5) with the address information ADDR_INFO read from the address storing unit 225. The address comparing unit 300 may generate a first match signal MATCH1 based on a result of the comparison. When the write row address ROW_ADDR does not match with the weak cell row address in the address information ADDR_INFO, the address comparing unit 300 may generate the first match signal MATCH1 having a first logic level to a switch 227 and transmit the same to the switch 227 and the refresh control circuit 400. When the write row address ROW_ADDR matches with the weak cell row address in the address information ADDR_INFO, the address comparing unit 300 may generate the first match signal MATCH1 having a second logic level and transmit the same to the switch 227 and the refresh control circuit 400.

The switch 227 may selectively provide the address information ADDR_INFO read from the address storing unit 225 to the refresh control circuit 400 based on logic level of the first match signal MATCH1. When the first match signal MATCH1 has the first logic level, the switch 227 does not provide the address information ADDR_INFO to the refresh control circuit 400. When the first match signal MATCH1 has a second logic level, the switch 227 provides the address information ADDR_INFO to the refresh control circuit 400. For example, when a row address ROW_ADDR is received from address register 220 that matches one of the address stored in address storing unit 225, the first match signal MATCH1 may transition form the first logic level to the second logic level. The second logic level may close switch 227 to allow transmission of the matching row address to the refresh control circuit 400. The transition of the first match signal MATCH1 from the first logic level to the second logic level may act to instruct the refresh control circuit to latch and process the transmitted matching row address.

The refresh control circuit 400 sequentially refreshes the memory cell rows or control the refresh of the weak cell row corresponding to the weak cell row address based on the first match signal MATCH1. For example, when the first match signal MATCH1 has a first logic level, the refresh control circuit 400 may sequentially refresh the memory cell rows. When the first match signal MATCH1 has a second logic level, the refresh control circuit 400 may control the refresh of the weak cell row such that the pause time of the weak cell row is be reduced.

Figure 6:
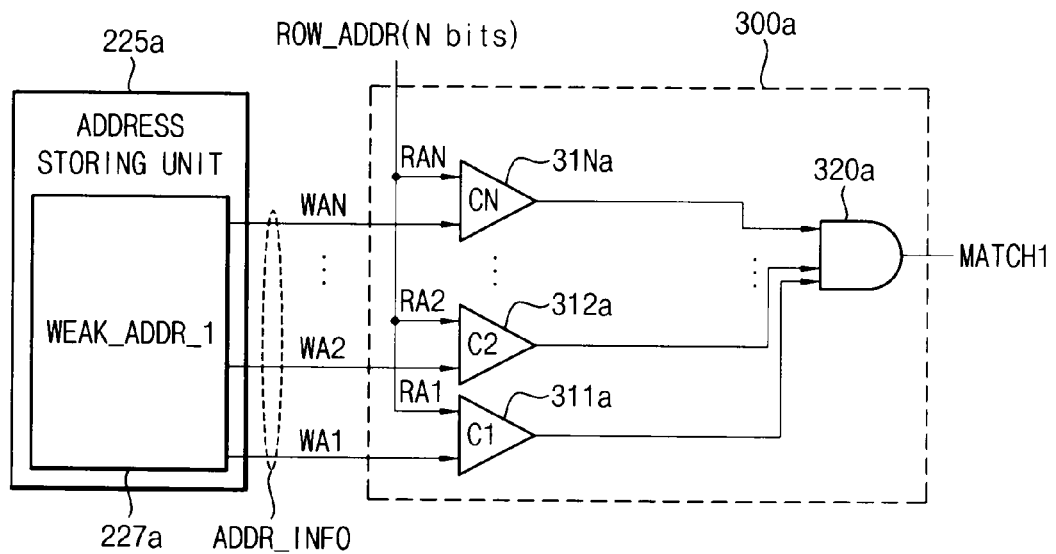
FIG. 6 illustrates an address storing unit and an address comparing unit in FIG. 5 according to an example embodiment.

FIG. 6 illustrates an exemplary address storing unit and an exemplary address comparing unit, which may correspond to those shown in FIG. 5.

Referring to FIG. 6, an address storing unit 225a may include a first storage area 227a that stores one or more weak cell row addresses. For ease of explanation, one weak cell address WEAK_ADDR_1 is shown. In some embodiments, the address storing unit 225a may be implemented with an electrically programmable fuse memory, a laser-programmable fuse memory, an anti-fuse memory, a one-time programmable memory, a flash memory, or other types of non-volatile memories.

The address comparing unit 300a may compare the row address ROW_ADDR received from the address register 220 with the address information ADDR_INFO read from the address storing unit 225a. The address comparing unit 300 may generate the first match signal MATCH1 based on a result of the comparison.

The address comparing unit 300a may include comparators 311a, 312a and 31Na and an AND gate 320a. The comparator 311a compares a first bit RA1 of the row address ROW_ADDR with a first bit WA1 of the weak cell row address WEAK_ADDR_1, the comparator 312a compares a second bit RA2 of the row address ROW_ADDR with a second bit WA2 of the weak cell row address WEAK_ADDR_1, the comparator 31Na compares a Nth bit RAN of the row address ROW_ADDR with a Nth bit WAN of the weak cell row address WEAK_ADDR_1 and the AND gate 320a performs an AND operation on outputs of the comparators 311a, 312a and 31Na to generate the first match signal MATCH1. Therefore, the first match signal MATCH1 has a first logic level when the write row address ROW_ADDR does not match with the weak cell row address WEAK_ADDR_1 and the first match signal MATCH1 has a second logic level when the write row address ROW_ADDR matches with the weak cell row address WEAK_ADDR_1.

Figure 7:
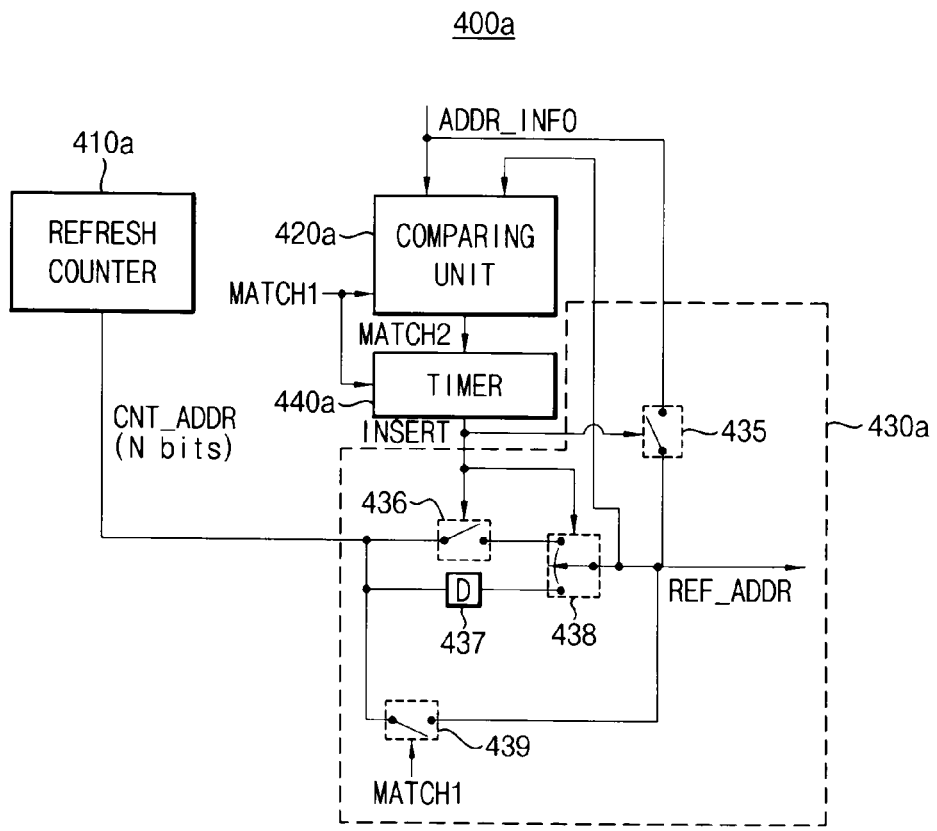
FIG. 7 is a block diagram illustrating an example of the refresh control circuit in FIG. 5 according to an example embodiment.

FIG. 7 is a block diagram illustrating an example of the refresh control circuit 400 in FIG. 5.

Referring to FIG. 7, a refresh control circuit 400a may include a refresh counter 410a, an address comparing unit 420a, a refresh row address output unit 430a and a timer 440a.

The refresh counter 410a may perform a counting operation to generate internal refresh row address CNT_ADDR for refreshing sequentially the memory cell rows. The internal refresh row address CNT_ADDR may have N bits, where N is an integer greater than 1.

The address comparing unit 420a is enabled when the first match signal MATCH1 has a second logic level. The address comparing unit 420a may compare the refresh row address REF_ADDR provided to the row address multiplexer 240 from the refresh row address output unit 430a with the address information ADDR_INFO read from the address storing unit 225a to generate a second match signal MATCH2 based on the comparison. When the weak cell row address WEAK_ADDR_1 does not match with the refresh row address REF_ADDR, the second match signal MATCH2 has a first logic level. When the weak cell row address WEAK_ADDR_1 matches with the refresh row address REF_ADDR, the second match signal MATCH2 has a second logic level.

The timer 440a is enabled when the first match signal MATCH 1 has a second logic level. Upon the transition of the first match signal MATCH1 from the first logic level to the second logic level, the timer 440a starts running (e.g., if timer 440a is a counter, it starts counting). If timer 440a receives the second match signal MATCH2 at the second logic level before a predetermined time has expired (indicating that a match has occurred between the refresh row address REF_ADDR and the weak cell row address WEAK_ADDR_1 provided as the address information ADDR_INFO), timer 440a maintains its output signal INSERT at a first logic level. If timer 440a does not receive the second match signal MATCH2 at the second logic level before a predetermined time has expired, timer 440a outputs the INSERT signal at a second logic level.

The refresh row address output unit 430a may include switches 435, 436, 438 and 439 and a delay element 437. A fourth switch 439 is connected when the first match signal MATCH1 has a first logic level and the fourth switch 439 is disconnected when the first match signal MATCH1 has a second logic level. That is, the fourth switch 439 is connected in response to the first match signal MATCH1 having a first logic level and provides the internal refresh row address CNT_ADDR as the refresh row address REF_ADDR to the address multiplexer 240 when the weak cell row address WEAK_ADDR_1 does not match with the write row address ROW_ADDR. First switch 435 is disconnected and second switch 436 is connected when the INSERT signal has the first logic level, and first switch 435 is connected and second switch 436 is disconnected when the INSERT signal has the second logic level. The delay element 437 has a delay amount corresponding to a refresh interval between two adjacent memory cell rows, and delays the internal refresh row address CNT_ADDR by the delay amount. The third switch 438 is connected to the second switch 436 when the INSERT signal has a first logic level and is connected to the delay element 437 when the INSERT signal has a second logic level.

The refresh row address output unit 430a may provide the internal refresh row address CNT_ADDR as the refresh row address REF_ADDR to the address multiplexer 240 when the first match signal MATCH1 has a first logic level. The first match signal MATCH1 at the first logic level may indicate that there has been no match between a row address received by the address register and any address stored in the address storing unit 225. In addition, the refresh row address output unit 430a may select either the internal refresh row address CNT_ADDR or the weak cell row address WEAK_ADDR_1 as the refresh row address REF_ADDR to the address multiplexer 240 when the first match signal MATCH1 has a second logic level, in dependence on the INSERT signal. In this case, a wordline of the kth memory cell row corresponding to the weak cell row address WEAK_ADDR_1 and a wordline of the (k+1)th memory cell row corresponding to the internal refresh row address CNT_ADDR may be sequentially enabled by the bank row decoder, and the kth memory cell row and the (k+1)th memory cell row may be sequentially refreshed. In the case where the banks 280a-280d of the volatile memory array may perform refresh operations in parallel, the weak cell row address and the memory cell row corresponding to the internal refresh row address CNT_ADDR may be refreshed simultaneously. In some alternative embodiments, both the internal refresh row address CNT_ADDR and the weak cell row address WEAK_ADDR_A may be provided to multiplexer 240 via different signal paths, and multiplexer 240 may control transmission of these row addresses to the appropriate bank row decoder 260a-260d to perform a respective refresh operation (either simultaneously or in sequence). In addition, the refresh row address output unit 430a may continue to provide delayed internally generated refresh row addresses via delay element 437 as the refresh row address REF_ADDR to the address multiplexer 240 when the first match signal MATCH1 has a second logic level and the INSERT signal has a second logic level.

Figure 8:
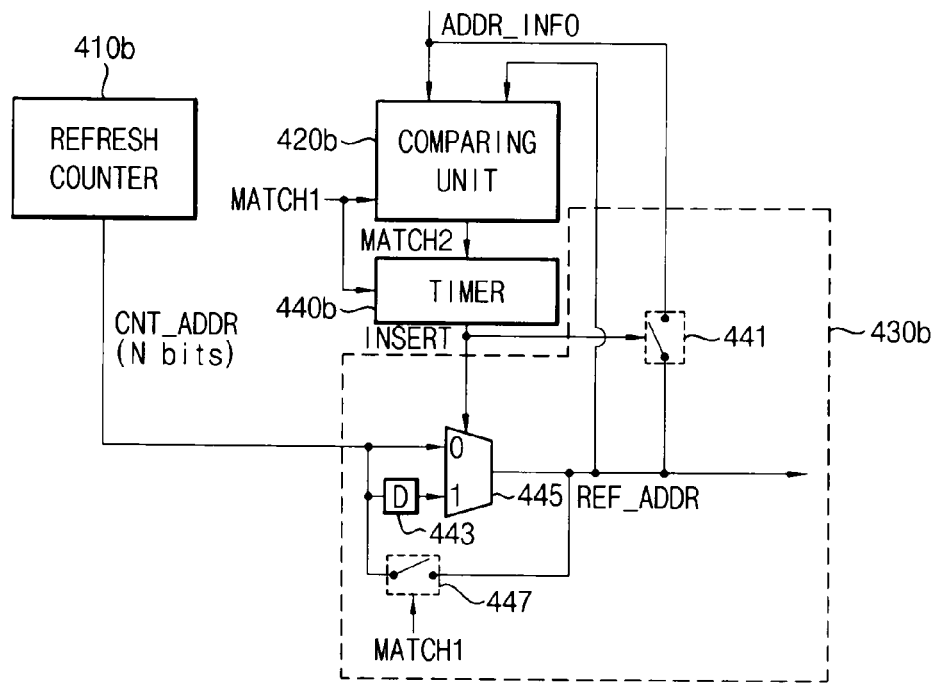
FIG. 8 is a block diagram illustrating an example of the refresh control circuit in FIG. 5 according to another example embodiment.

FIG. 8 is a block diagram illustrating an example of the refresh control circuit in FIG. 5 according to another example embodiment.

Referring to FIG. 8, a refresh control circuit 400b may include a refresh counter 410b, an address comparing unit 420b, a refresh row address output unit 430b and a timer 440b.

The refresh counter 410b may perform a counting operation to generate internal refresh row address CNT_ADDR for refreshing sequentially the memory cell rows. The internal refresh row address CNT_ADDR may have N bits, where N is an integer greater than 1.

The address comparing unit 420b is enabled when the first match signal MATCH1 has a second logic level. The address comparing unit 420b may compare the refresh row address REF_ADDR provided to the row address multiplexer 240 from the refresh row address output unit 430a with the address information ADDR_INFO read from the address storing unit 225a (e.g., WEAK_ADDR_1) to generate a second match signal MATCH2 based on the comparison. When the weak cell row address WEAK_ADDR_1 does not match with the refresh row address REF_ADDR, the second match signal MATCH2 has a first logic level. When the weak cell row address WEAK_ADDR_1 matches with the refresh row address REF_ADDR, the second match signal MATCH2 has a second logic level.

The timer 440b is enabled when the first match signal MATCH 1 has a second logic level. Upon the transition of the first match signal MATCH1 from the first logic level to the second logic level, the timer 440b starts running (e.g., if timer 440b is a counter, it starts counting). If timer 440b receives the second match signal MATCH2 at the second logic level before a predetermined time has expired (indicating that a match has occurred between the refresh row address REF_ADDR and the weak cell row address WEAK_ADDR_1 provided as the address information ADDR_INFO), timer 440b maintains its output signal INSERT at a first logic level. If timer 440b does not receive the second match signal MATCH2 at the second logic level before a predetermined time has expired, timer 440b outputs the INSERT signal at a second logic level.

The refresh row address output unit 430b may include switches 441 and 447, a delay element 443 and a multiplexer 445. A second switch 447 is connected when the first match signal MATCH1 has a first logic level and the fourth switch 447 is disconnected when the first match signal MATCH1 has a second logic level. That is, the second switch 447 is connected in response to the first match signal MATCH1 having a first logic level and provides the internal refresh row address CNT_ADDR as the refresh row address REF_ADDR to the address multiplexer 240 when the weak cell row address WEAK_ADDR_1 does not match with the write row address ROW_ADDR. The first switch 441 is disconnected when the INSERT signal has a first logic level, and the first switch 441 is connected when the INSERT signal has a second logic level. The delay element 437 has a delay amount corresponding to tRC (a row cycle time, e.g., a time elapse set for a start of a first active operation of the row to the start of a second active operation), and delays an output of the internal refresh row address CNT_ADDR by the delay amount (and subsequently generated internal refresh row addresses CNT_ADDR). The multiplexer 445 selects the internal refresh row address CNT_ADDR when the INSERT signal has a first logic level and selects output of the delay element when the INSERT signal has a second logic level.

The refresh row address output unit 430b may provide the internal refresh row address CNT_ADDR as the refresh row address REF_ADDR to the address multiplexer 240 when the first match signal MATCH1 has a first logic level. In addition, the refresh row address output unit 430b may select either the internal refresh row address CNT_ADDR as the refresh row address REF_ADDR or the weak cell row address WEAK_ADDR_1 as the refresh row address REF_ADDR and provide the selected address to the address multiplexer 240 when the first match signal MATCH1 has a second logic level in dependence on the INSERT signal. In addition, the refresh row address output unit 430b may provide consecutively delayed internal refresh row address as the refresh row address REF_ADDR to the address multiplexer 240 when the first match signal MATCH1 has a second logic level and the INSERT signal a second logic level. It should be emphasized that the reference to first and second logic levels in connection with the described signals (e.g., MATCH1, MATCH2, INSERT, etc.) should not imply that the described first logic levels should be the same as each other, nor that the second logic levels should be the same as each other. As will be appreciated, the first and second logic levels described are with respect to an individual signal to indicate a change or difference in the logic of that signal.

Figure 9:
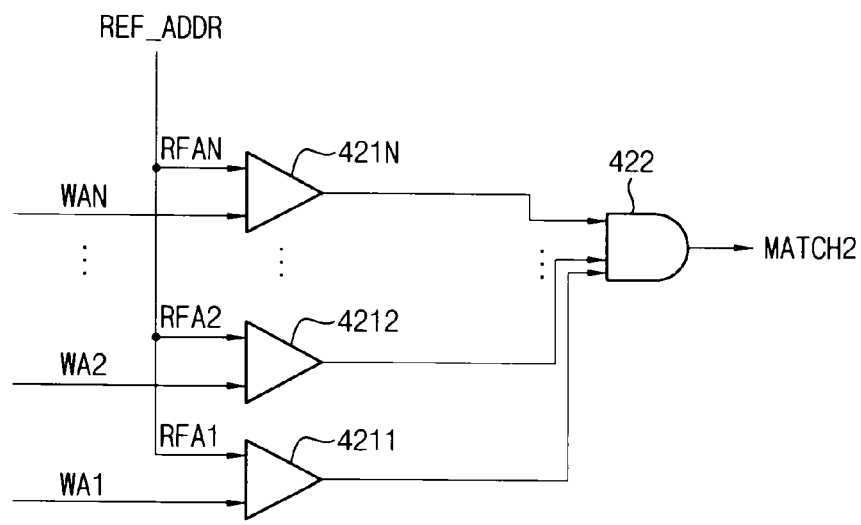
FIG. 9 is a circuit diagram illustrating an example of the address comparing unit in FIG. 7 according to an example embodiment.

FIG. 9 is a circuit diagram illustrating an example of the address comparing unit in FIG. 7 according to an example embodiment.

Referring to FIG. 9, an address comparing unit 420a may include comparators 4211, 4212 and 421N and an AND gate 422. The comparator 4211 compares a first bit RFA1 of the refresh row address REF_ADDR with a first bit WA1 of the weak cell row address WEAK_ADDR_1, the comparator 4212 compares a second bit RFA2 of the refresh row address REF_ADDR with a second bit WA2 of the weak cell row address WEAK_ADDR_1, the comparator 421N compares a Nth bit RFAN of the refresh row address REF_ADDR with a Nth bit WAN of the weak cell row address WEAK_ADDR_1 and the AND gate 422 performs an AND operation on outputs of the comparators 4211, 4212 and 421N to generate the second match signal MATCH2. Therefore, the second match signal MATCH2 has a first logic level when the refresh row address REF_ADDR does not match with the weak cell row address WEAK_ADDR_1 and the second match signal MATCH2 has a second logic level when the refresh row address REF_ADDR matches with the weak cell row address WEAK_ADDR_1. Although not shown in FIG. 9, signal MATCH1 may be a separate input to AND gate 422 or be used to enable one or more comparators 4211, 4212 . . . 421N. Alternatively, address comparing unit 420a may be input to a flip flop which is set by MATCH1 and has a Q output to the AND gate 422. The flip flop may be reset in response to various signals, such as in response to either the MATCH2 signal or INSERT signal transitioning to the respective second logic level.

The address comparing unit 420b in FIG. 8 may have substantially the same configuration as the address comparing unit 420a in FIG. 9.

Figure 10:
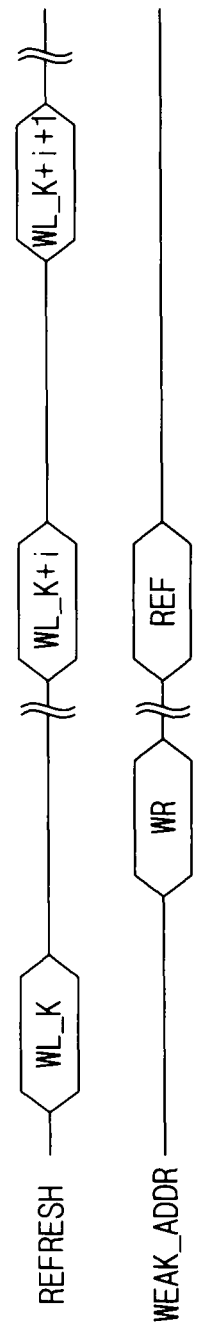
FIGS. 10 through 12 are diagrams for explaining operation of the volatile memory device.
Figure 11:
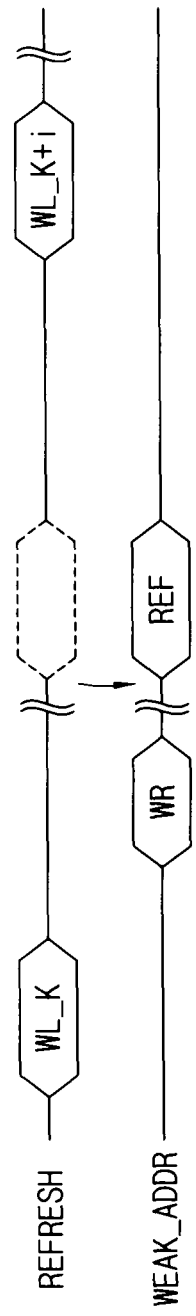
Figure 12:
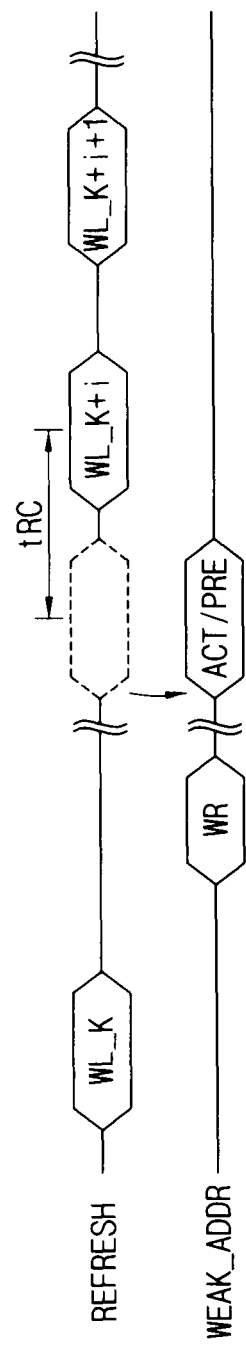

FIGS. 10 through 12 are diagrams for explaining an operation of the volatile memory device.

In FIG. 10, the weak cell row address WEAK_ADDR does not match with the refresh row address REF_ADDR.

Referring to FIG. 10, the kth memory cell row is refreshed (WL_K) according to kth refresh row address. Write command WR is received to write to the weak cell row corresponding to the weak cell row address WEAK_ADDR and data is written in the weak cell row. Since the weak cell row address WEAK_ADDR does not match with the refresh row address REF_ADDR, the weak cell row corresponding to the weak cell row address WEAK_ADDR is simultaneously refreshed when (k+i)th memory cell row, corresponding to one of refresh row addresses after the kth refresh row address, is refreshed (WL_k+i) within the predetermined time. The predetermined time may correspond to a number of i refresh operations occurring after the receipt of the write command WR. After that, (k+i+1)th memory cell row corresponding to the (k+i+1)th refresh row address successive to the (k+i)th refresh row address is refreshed (WL_k+i+1).

In FIGS. 11 and 12, the weak cell row address WEAK_ADDR matches with the refresh row address REF_ADDR.

Referring to FIG. 11, the kth memory cell row is refreshed (WL_K) according to kth refresh row address. Write command WR is received to write to the weak cell row corresponding to the weak cell row address WEAK_ADDR and data is written in the weak cell row. Since the weak cell row address WEAK_ADDR matches with one of the refresh row address REF_ADDR during the predetermined time (since the receipt of the write command WR), the refresh sequence of refresh addresses CNT_ADDR generated by refresh counter does not need to be altered, and no additional refresh operation for the weak cell row is needed.

As described above, in a method of operating a volatile memory device according to an example embodiment, the pause time may be reduced by rewriting the data in the weak cell row by refreshing the weak cell row simultaneously while refreshing the one of memory cell rows to be refreshed after the kth memory cell row in the predetermined time or activating/precharging the weak cell row while postponing refreshing one of memory cell rows to be refreshed after the kth memory cell row in the predetermined time.

Referring to FIG. 12, the kth memory cell row is refreshed (WL_K) according to kth refresh row address. Write command WR is received to write to the weak cell row corresponding to the weak cell row address WEAK_ADDR and data is written in the weak cell row. Since the weak cell row address WEAK_ADDR does not match any of refresh row addresses REF_ADDR within the predetermined time, the weak refresh sequence of refresh addresses CNT_ADDR generated by the refresh counter is modified to insert a refresh operation of the weak cell row. The refresh operation of the (k+i)th memory cell row is postponed by a time tRC (row cycle time). After the time elapses corresponding to refresh interval (either from the refresh operation of the weak cell row address or the (k+i)th memory cell row refresh operation, an auto refresh operation resumes with row (WL_k+i+1). The refresh interval may be substantially larger than the row cycle time tRC, for example at least 5 times greater than, 10 times greater than or at least 50 times greater than the row cycle time tRC. For example, a refresh interval may be set to 3.9 microseconds with a row cycle time tRC of about 60 nanoseconds.

Figure 13:
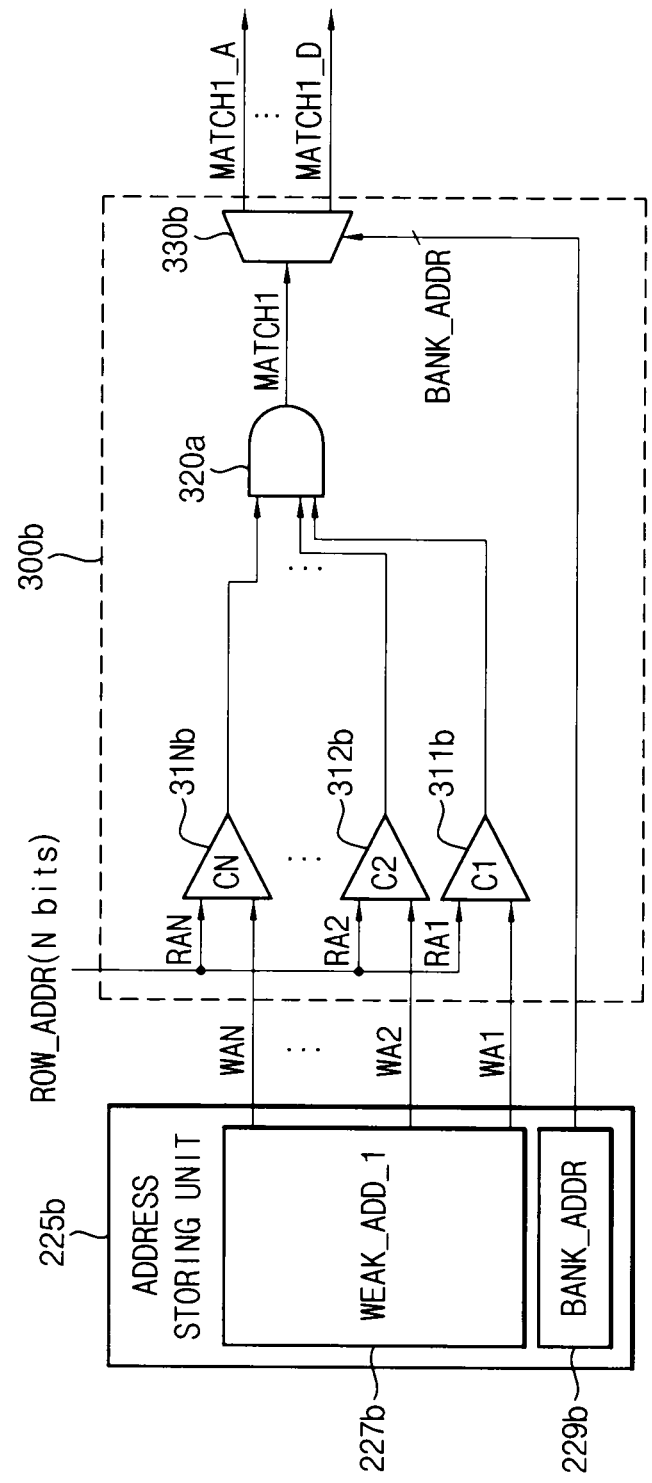
FIG. 13 is a block diagram illustrating an address storing unit and an address comparing unit in FIG. 5 according to another example embodiment.

FIG. 13 is a block diagram illustrating an exemplary address storing unit and an exemplary address comparing unit, which may be those described with respect to FIG. 5.

Referring to FIG. 13, an address storing unit 225b may include a first storage area 227b that stores the weak cell row address WEAK_ADDE_1 and a second storage area 229b that stores bank address BANK_ADDR as bank information.

The address comparing unit 300b may receive the row address ROW_ADDR and the bank address BANK_ADDR and may compare the row address ROW_ADDR received from the address register 220 with the address information ADDR_INFO read from the address storing unit 225b to generate the first match signal MATCH1 to one of the banks 265a, 265b, 265c and 265d corresponding to the bank address BANK_ADDR.

The address comparing unit 300b may include comparators 311b, 312b and 31Nb, an AND gate 320b and a demultiplexer 330b. The comparators 311b, 312b and 31Nb and the AND gate 320a provides the first match signal MATCH1 having a second logic level to the demultiplexer 330b when the write row address ROW_ADDR matches with the weak cell row address WEAK_ADDR_1. The demultiplexer 330b may output the first match signal MATCH1 as bank match signals MATCH1_A~MATCH1_D corresponding to the bank address BANK_ADDR. Therefore, the first match signal MATCH1 is applied to one of the banks 265a, 265b, 265c and 265d corresponding to the bank address BANK_ADDR.

The bank match signal of the bank match signals MATCH1_A~MATCH1_D corresponding to the bank address BANK_ADDR is activated, the refresh control circuit 400 controls refresh of the weak cell row based on whether the weak cell row address according to one or more of the methods described herein.

Figure 14:
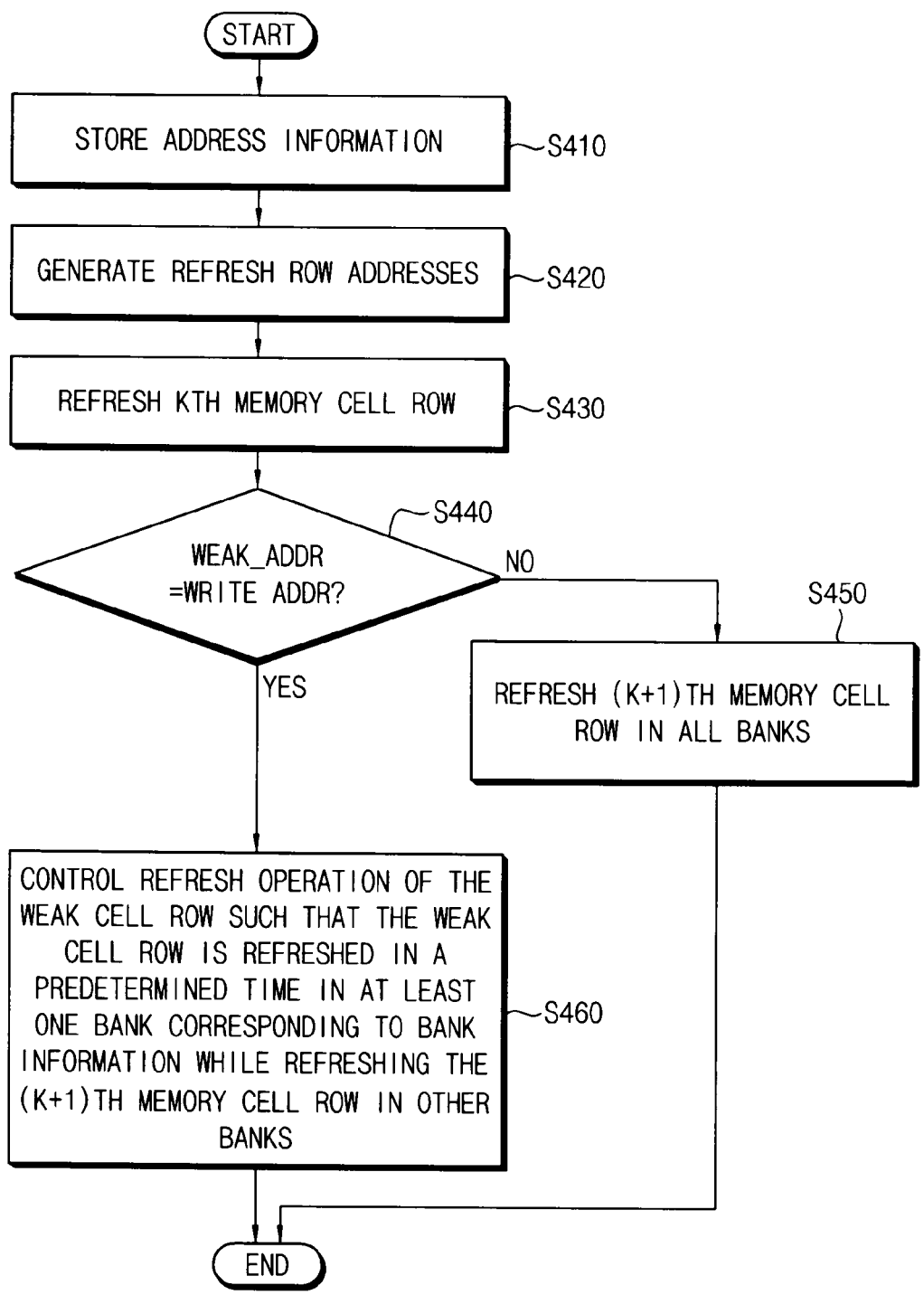
FIG. 14 is a flow chart illustrating a method of operating a volatile memory device according to some exemplary embodiments.

FIG. 14 is a flow chart illustrating a method of operating a volatile memory device according to some exemplary embodiments.

FIG. 14 is a flow chart illustrating a method of operating a volatile memory device when the address storing unit 225b and the address comparing unit 300b in FIG. 13 are included in the volatile memory device 200 of FIG. 5.

Referring to FIGS. 13 and 14, address information ADDR_INFO is stored in the address storing unit 225b (S410). The address information ADDR_INFO may include weak cell row address WEAK_ADDR_1 of a weak cell row that includes at least one weak cell whose write performance is worse than normal cell and the bank address BANK_ADDR. The address information ADDR_INFO may be stored in the address storing unit 225b before or after the volatile memory device is packaged. Refresh row addresses are generated (S420). Generation of refresh row addresses may initiate refresh operation of the volatile memory device.

Kth memory cell row corresponding to kth refresh row address is refreshed (S430), where k is a natural number. While the memory cell rows are refreshed (when the kth memory cell row is refreshed and data is written in the kth memory cell row before (k+1)th memory cell row is refreshed), write row address for writing data in one of the memory cell rows is compared with the weak cell row address (S440). When the write row address WRITE_ADDR does not match with the weak cell row address WEAK_ADDR (NO in S440), (k+1)th memory cell row corresponding (k+1)th refresh row address is refreshed in all banks (S450). When the write row address WRITE_ADDR matches with the weak cell row address WEAK_ADDR (NO in S450), refresh of the weak cell row is performed within a predetermined time. For example, the weak cell row in the bank corresponding to the bank address BANK_ADDR is refreshed at the same time that the (k+1)th memory cell row corresponding to the (k+1)th refresh row address is refreshed in other banks (S460). The (k+1)th memory cell row corresponding to the bank address BANK_ADDR may be refreshed immediately subsequent to the refresh of the weak cell row. The (k+1)th memory cell row corresponding to the bank address BANK_ADDR may start its refresh operation at row cycle time tRC time interval after initiation of the refresh operation of the weak cell row. In addition, the pause time may be reduced by controlling the refresh of the weak cell row (e.g., selectively refreshing the weak cell row) based on whether the weak cell row address matches with the scheduled refresh row addresses in the bank corresponding to the bank address BANK_ADDR.

Figure 15:
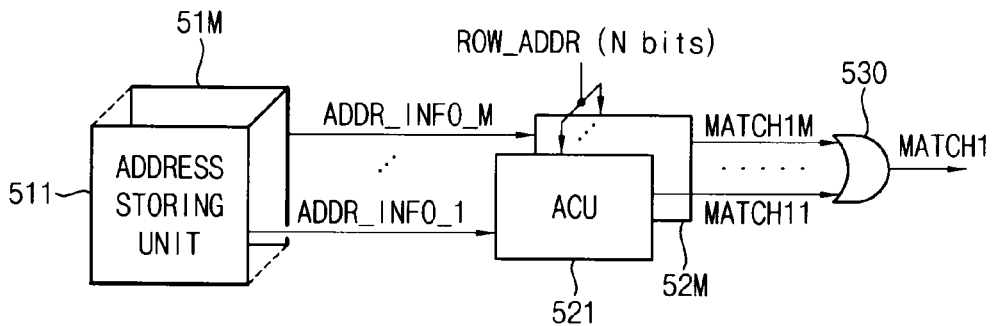
FIG. 15 is a block diagram illustrating an address storing unit and an address comparing unit in FIG. 5 according to still another example embodiment.

FIG. 15 is a block diagram illustrating an exemplary address storing unit and an exemplary address comparing unit, which may be those as described with respect to FIG. 5.

Referring to FIG. 15, a volatile memory device 200 may include a plurality of address storing units 511~51M, a plurality of address comparing units 521~52M and an OR operating unit 530.

The plurality of address storing units 511~51M may store a plurality of address information ADDR_INFO 1 and ADDR_INFO_M for a plurality of weak cell rows, respectively. In some embodiments, the plurality of address storing units 511~51M may be implemented with one storage device. In other embodiments, the plurality of address storing units 511~51M may be implemented with a plurality of storage devices. For example, each storage device may be an electrically programmable fuse memory, a laser-programmable fuse memory, an anti-fuse memory, a one-time programmable memory, a flash memory, or other types of nonvolatile memories, etc.

The plurality of address comparing units 521~52M are coupled to the plurality of address storing units 511~51M, respectively. The plurality of address comparing units 521~52M may compare the refresh row address REF_ADDR received from the address register 220 with the plurality of address information ADDR_INFO 1 and ADDR_INFO_M read from the plurality of address storing units 511~51M. The plurality of address comparing units 521~52M may generate a plurality of match signals MATCH11~MATCH1M based on a result of the comparison.

The OR operating unit 530 may generate a first match signal MATCH1 by performing an OR operation on the plurality of match signals MATCH11~MATCH1M received from the plurality of address comparing units 521~52M.

Figure 16:
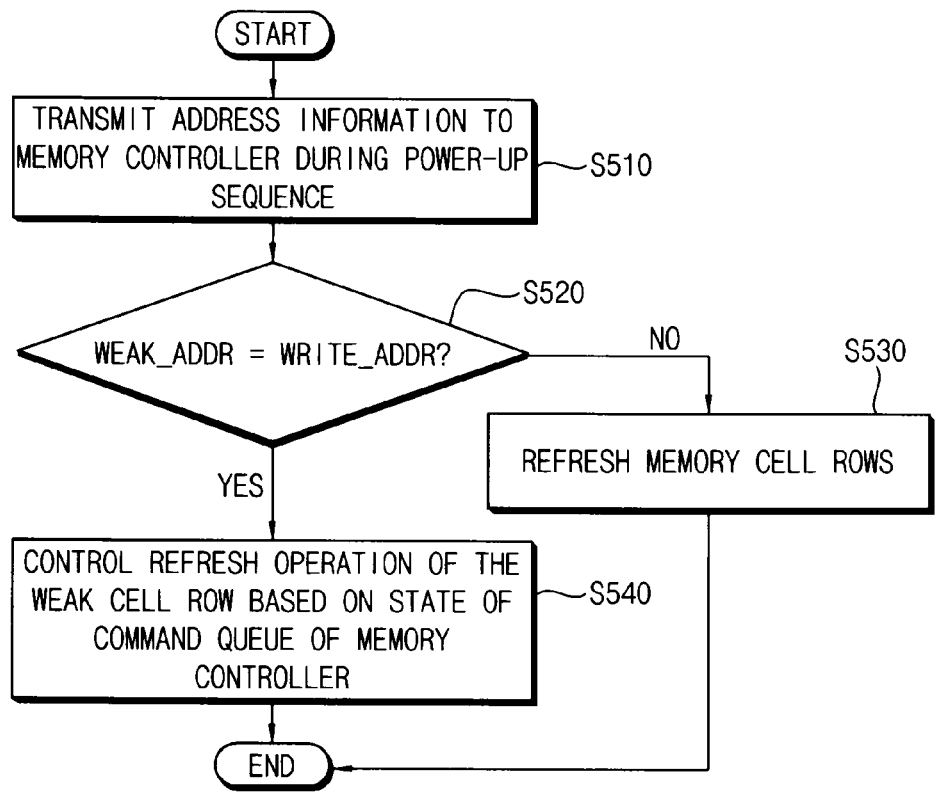
FIG. 16 is a flow chart illustrating a method of controlling a memory system according to some example embodiments.

FIG. 16 is a flow chart illustrating a method of controlling a memory system according to some example embodiments.

Referring to FIG. 16, address information is transmitted to a memory controller from a volatile memory device during a power-up sequence of the memory system (S510). The address information may be transmitted to an address comparing unit of the memory controller from an address storing unit of the volatile memory device. Weak cell row addresses in the address information is compared with a write row address for accessing memory cell rows of the volatile memory device in the address comparing unit of the memory controller (S520). When the weak cell row address does not match with the write row address (NO in S520), the memory controller controls the volatile memory device such that the memory cell rows are refreshed (S530) according to a predetermined schedule (e.g., refreshing rows in sequence, according to a pattern, according to relative positions, or by referencing a table). When the weak cell row address matches with the write row address (YES in S520), the memory controller controls refresh of the weak cell row based on idle state of a command queue of the memory controller (S540). For example, the memory controller modifies a schedule of refresh operations to insert a refresh operation for the weak cell row during an idle state of the command queue.

In a method of controlling the memory system in FIG. 16, when the weak cell row address matches with the write row address, the refresh of the weak cell row is controlled based on the on the idle state of the command queue of the memory controller.

Figure 17:
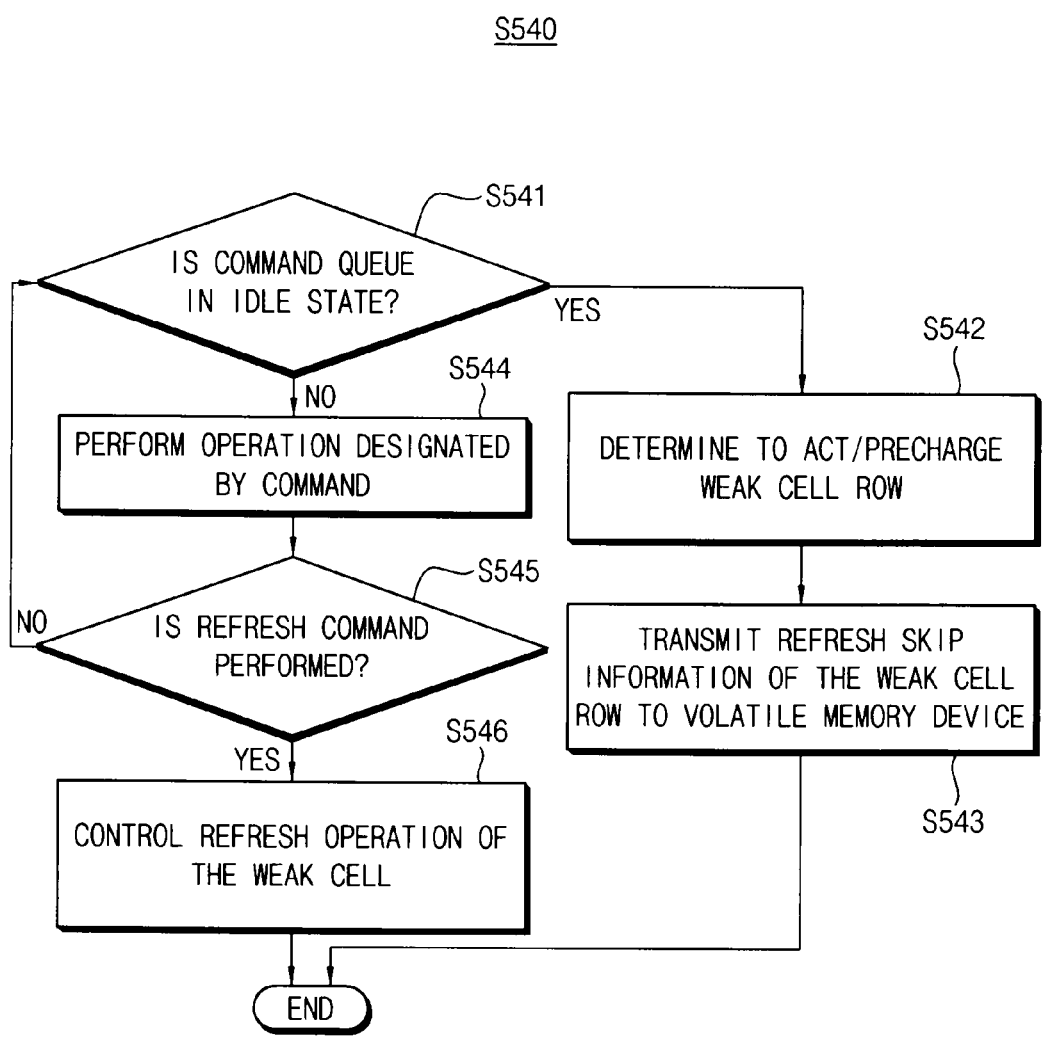
FIG. 17 is a flow chart illustrating the step (S540) in FIG. 16 according to an example embodiment.

FIG. 17 is a flow chart illustrating the step (S540) in FIG. 16 according to an example embodiment.

Referring to FIG. 17, it is determined whether the command queue of the memory controller is in the idle state (S540) for controlling the refresh of the weak cell row. When the command queue is in the idle state, the memory controller performs no operation on the volatile memory device.

When the command queue is in the idle state (YES in S541), the weak cell row corresponding to the weak cell row address is determined to have been activated and precharged after the write operation to the weak cell row (S542). Activation and precharge operations may be equivalent to or the same as a refresh operation in some memory devices. The memory controller transmits refresh skip information for skipping refresh of the weak cell row to the volatile memory device (S543). If it is determined in step S542 that the weak cell row has not been precharged, the method may proceed to step S546 (not shown in FIG. 17).

When the command queue is not in the idle state but in busy state (NO in S541), the operation is performed according to command stored in the command queue (S544). It is determined whether refresh command is included in the performed command (S545). When the refresh command is not included in the performed command (NO in S545), the method returns to the step (S241). When the refresh command is included in the performed command (YES in S545), the memory controller controls the volatile memory device such that the weak cell row corresponding to the weak cell row address is refreshed (S546).

Figure 18:
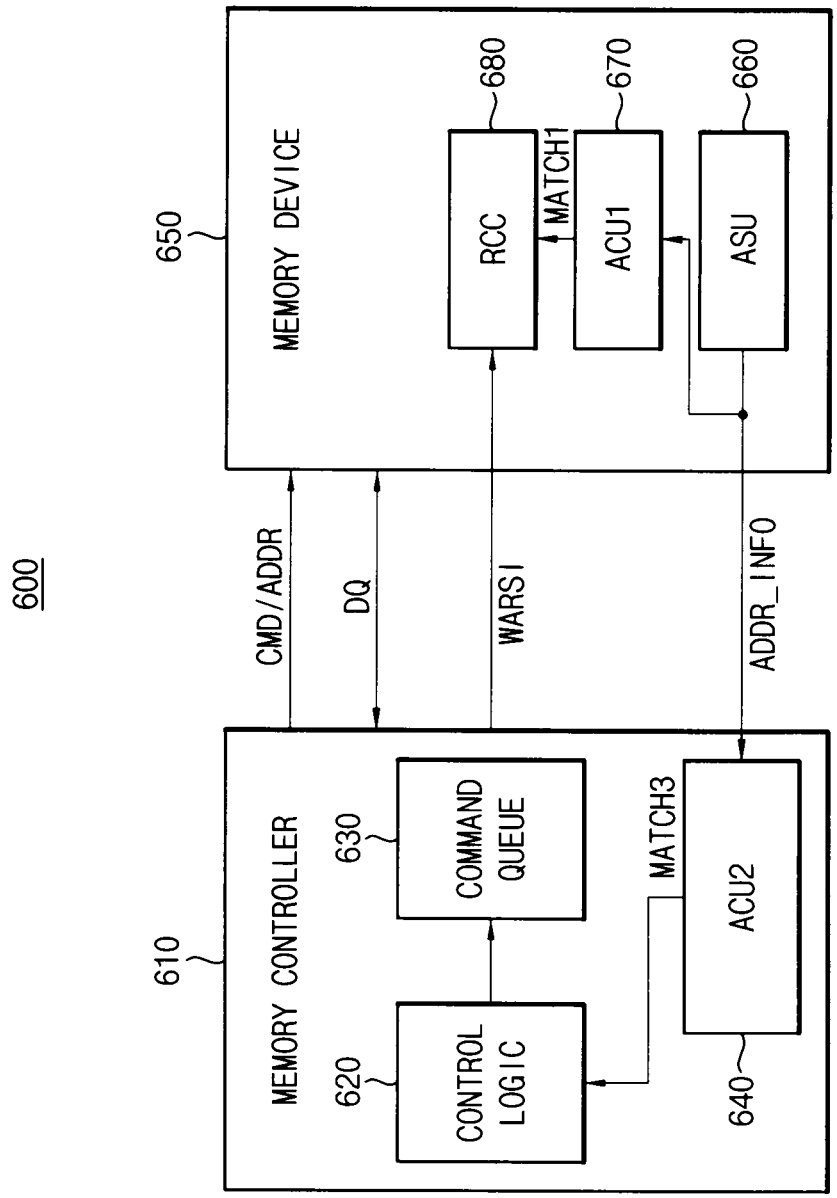
FIG. 18 is a block diagram illustrating a memory system performing a method of FIG. 17 according to an example embodiment.

FIG. 18 is a block diagram illustrating a memory system performing a method of FIG. 17 according to an example embodiment.

Referring to FIG. 18, a memory system 600 includes a memory controller 610 and a volatile memory device 650. The memory controller 610 transmits command CMD and address ADDR and exchanges data DQ with the volatile memory device 650.

The memory controller 610 includes a control logic 620, a command queue 630 and an address comparing unit 640. The volatile memory device 650 includes an address storing unit 660, an address comparing unit 370 and a refresh control circuit 680. The address comparing unit 670 compares address information ADDR_INFO with the write row address ROW_ADDR received from the memory controller 610 to provide a first match signal MATCH1 to the refresh control circuit 680.

The address information ADDR_INFO including the weak cell row address is transmitted to the address comparing unit 640 from the address storing unit 660. The memory controller 610 may include an address storing unit 660' (not shown) to receive and store the addresses ADDR_INFO transmitted from the address storing unit 660 of the memory device 650 (ADDR_INFO in FIG. 18). This may be done during a power-up sequence of the memory system 600. The address storing unit 660' may be within the address comparing unit block 640 in FIG. 18. The address comparing unit 640 compares the address information ADDR_INFO stored in address storing unit 660' with the write row address for accessing memory cell rows of the volatile memory device 650 to provide a third match signal MATCH3 to the control logic 620 based on the comparison (e.g., as described with respect to address storing unit 225a and address comparison unit 300a in FIG. 6). In alternative embodiments, the address storing unit 660' may be a non-volatile memory and be programmed with the ADDR_INFO corresponding to weak addresses of one or more memory devices 650 (e.g., after testing a memory system during manufacturing). In these alternatives, address storing unit(s) 660 of the memory device(s) 650 may be unnecessary.

For example, when the weak cell row address does not match with the write row address, the third match signal MATCH3 has a first logic level. When the third match signal MATCH3 has a first logic level, the control logic 620 controls the refresh control circuit 680 such that the memory cell rows are refreshed according to refresh row addresses internally generated by the memory device 650, such as by an address counter in the refresh control circuit 680 or referencing a table in the refresh control circuit 680.

When the weak cell row address matches with the write row address, the third match signal MATCH3 has a second logic level. When the third match signal MATCH3 has a second logic level, the control logic 620 monitors the command queue 630 and controls the volatile memory device 650 based on whether command queue 630 is in the idle state such that the refresh control circuit 680 controls the refresh of the weak cell row. For example, the control logic 620 may provide a refresh command for the weak cell row during the next idle period of the memory controller, or when it may be possible to provide a refresh command without interrupting issuance of commands in the command queue 630. Alternatively and/or in addition, the control logic 620 may interrupt issuance of commands in the command queue to provide a refresh command for the weak cell row, e.g., to assure refreshing of the weak cell row within the predetermined time after the write operation to the weak cell row.

When the command queue is in the idle state, the control logic 620 may transmit refresh skip information for skipping refresh of the weak cell row WARSI to refresh control circuit 680 upon determining that the weak cell row has been activated and precharged. When the command queue is in the idle state, the control logic 620 controls the volatile memory device 650 such that the volatile memory device 650 performs command stored in the command queue 630. When the command stored in the command queue 630 includes refresh command, the control logic 620 controls the volatile memory device 650 such that the weak cell row is refreshed. Alternative embodiments contemplate that the modification of a refresh schedule may be performed solely by the memory controller 610. For example, address comparison unit 670 may be eliminated from memory device 650.

Figure 19:
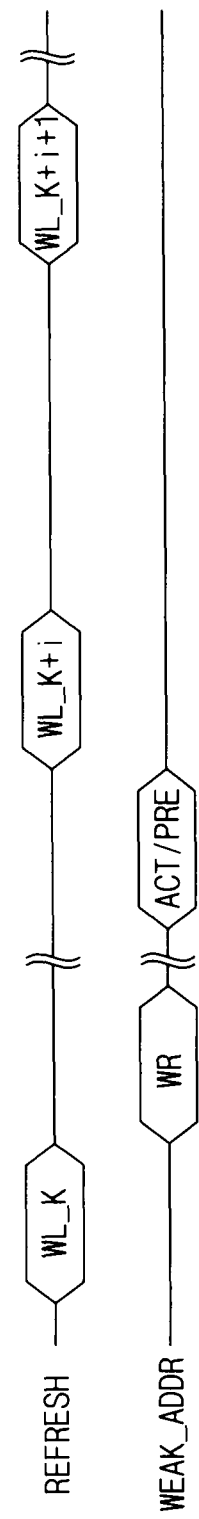
FIGS. 19 and 20 are diagrams for explaining operation of the memory system of FIG. 18 according to some example embodiments.
Figure 20:
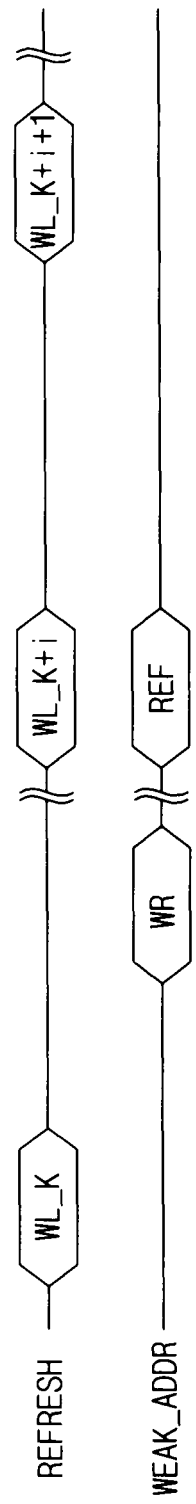

FIGS. 19 and 20 are diagrams for explaining operation of the memory system of FIG. 18 according to some example embodiments.

In FIGS. 19 and 20, the weak cell row matches with the write row address.

In FIG. 19, it is assumed that the command queue 630 is in the idle state.

Referring to FIG. 19, the kth memory cell row is refreshed (WL_K) according to kth refresh row address. Write command WR is received to write to the weak cell row corresponding to the weak cell row address WEAK_ADDR and data is written in the weak cell row. Since the command queue 630 is in the idle state, the control logic 620 controls the volatile memory device 650 and transmits refresh information to insert a refresh operation of the weak cell row WARSI. This may be a done by providing a normal refresh command, or it may be a command to alter a schedule of refresh operations refresh control circuit 680 such that the weak cell row is refreshed (activated and precharged (ACT/PRE)). Then, the (k+i)th memory cell row is refreshed (WL_K+i) (e.g., immediately after precharge of the weak cell row, e.g., within a row cycle time tRC). After that, the (k+i+1)th memory cell row is refreshed (WL_K+i+1). The memory cell row WL_K+i+1 may be refreshed immediately after refreshing row WL_K+1, or it may be delayed, such as delayed by a refresh interval (e.g., for example after a refresh interval at least 5 times greater than, 10 times greater than or at least 50 times greater than the row cycle time tRC).

In FIG. 20, it is assumed that the command queue 630 is in the idle state.

Referring to FIG. 20, the kth memory cell row is refreshed (WL_K) according to kth refresh row address. The operation may be the same as that described above with respect to FIG. 19, except that the weak cell row and the next scheduled row to be refreshed WL_K+I may be refreshed at the same time.

As described with reference to FIGS. 16 to 20, the pause time of the weak cell row may be reduced by controlling the refresh of the weak cell row (selectively refreshing the weak cell row) based on whether the command queue is in the idle state. Therefore, write performance of the weak cell row may be enhanced.

Figure 21:
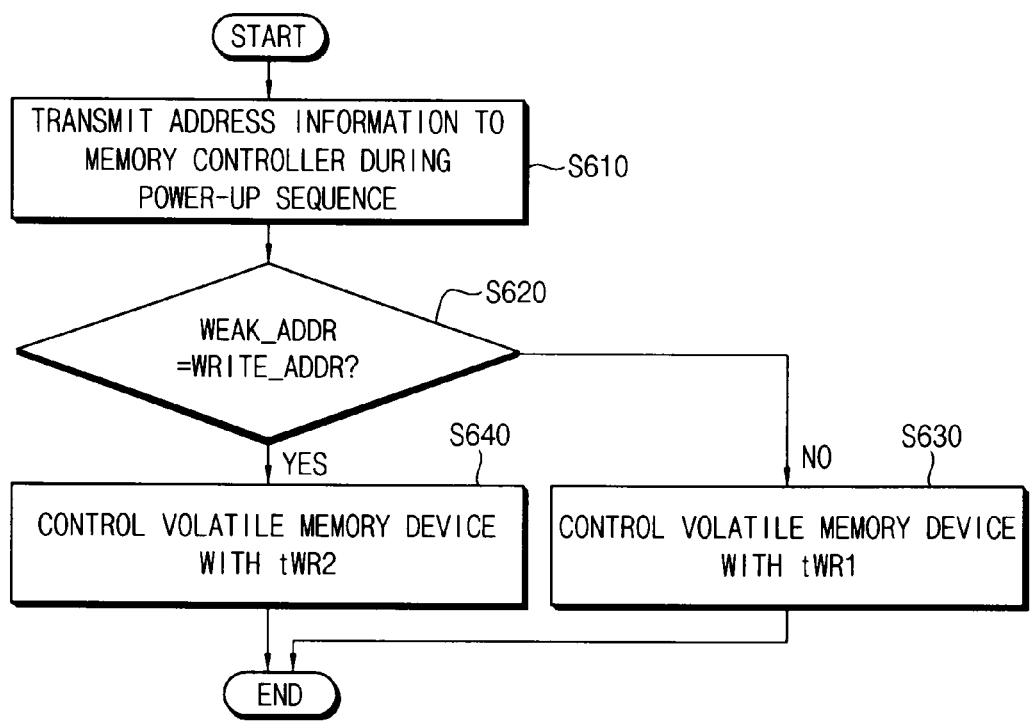
FIG. 21 is a flow chart illustrating a method of controlling a memory system according to other example embodiments.

FIG. 21 is a flow chart illustrating a method of controlling a memory system according to other example embodiments.

Referring to FIG. 21, address information is transmitted to a memory controller from a volatile memory device during a power-up sequence of the memory system (S610). The address information may be transmitted to an address comparing unit of the memory controller from an address storing unit of the volatile memory device. One or more weak cell row addresses in the address information are compared with a write row address for accessing memory cell rows of the volatile memory device in the address comparing unit of the memory controller (S620). A transaction processor of the memory controller controls the volatile memory device with different time windows including a first time window depending on a first write recovery times for normal cell rows other than a weak cell row corresponding to the weak cell row address and a second time window depending on a second write recovery time for the weak cell row (S630 and S640).

When the write row address does not match with the weak cell row address (NO in S620), the transaction processor controls the volatile memory device such that the second write recovery time is same as a first write recovery time tWR1, such as the suggested or minimal write recovery time defined in a specification (S630). When the write row address matches with the weak cell row address (YES in S630), the transaction processor controls the volatile memory device such that the second write recovery time tWR2 is longer than the first write recovery time (S640). The write recovery time of the weak cell row may be at least twice that as the write recovery time of the normal cell row. For example a write recovery time tWR for normal cell rows (e.g., according to a specification) may be 15 ns, whereas a write recovery time for a weak cell row may be 30 ns. The write recovery time tWR may correspond to the time the memory cells are written to, thus writing to the weak cell rows may be twice as long as that of a normal cell row. For example, in a synchronous DRAM, the write recovery time tWR may be the time from a data latching clock edge immediately following the input of the last portion of data to be written with a write command to a time when a precharge command may be properly input by the synchronous DRAM (corresponding to the time T9 to Tm in FIG. 24). The longer write recovery time may allow more time for weak cell rows to be properly programmed (e.g., to allow capacitors of a DRAM to be properly charged).

Figure 22:
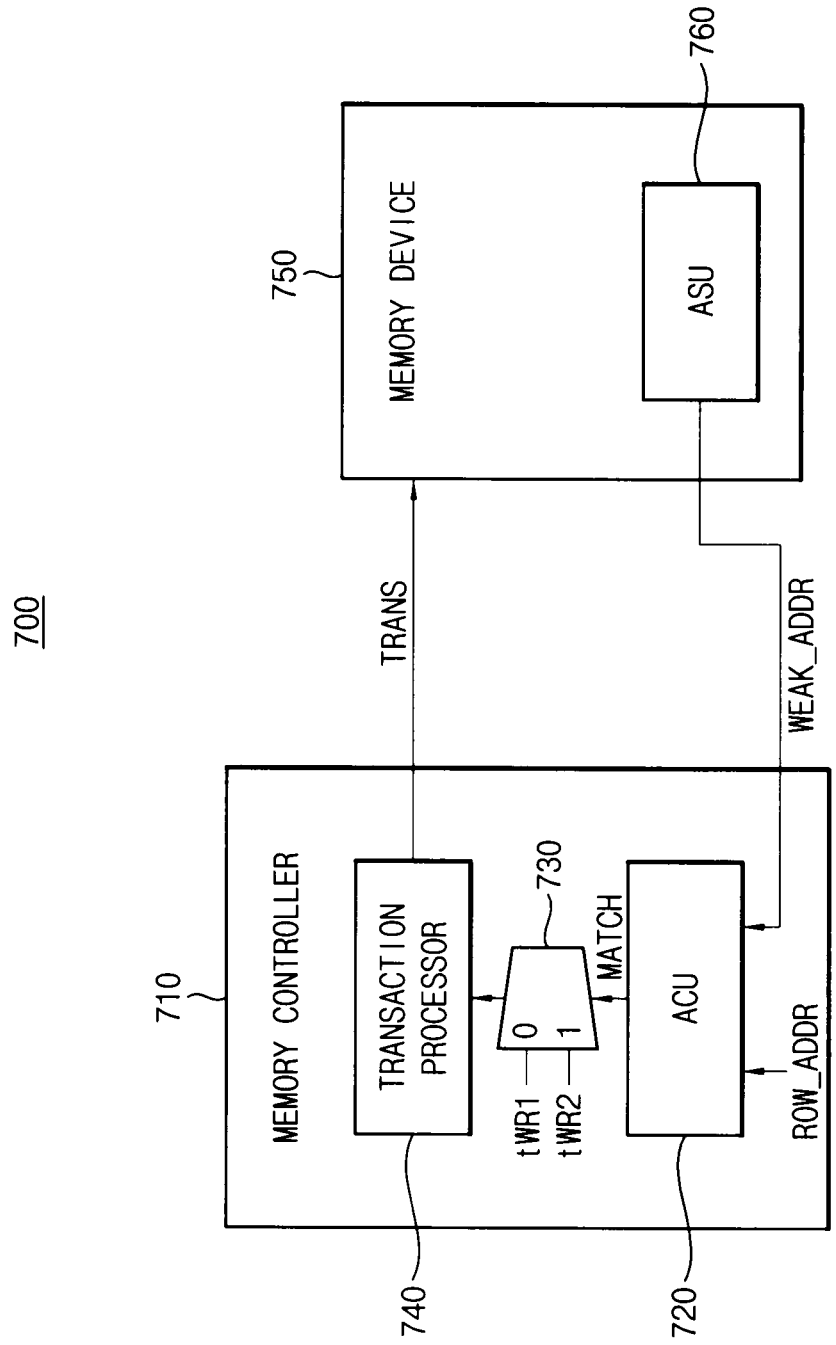
FIG. 22 is a block diagram illustrating a memory system performing a method of FIG. 21 according to an example embodiment.

FIG. 22 is a block diagram illustrating a memory system performing a method of FIG. 21 according to an example embodiment.

Referring to FIG. 22, a memory system 700 includes a memory controller 710 and a volatile memory device 750. The memory controller 710 includes an address comparing unit 720, a multiplexer 730 and a transaction processor 740. The volatile memory device 750 includes an address storing unit 760 that stores address information (weak cell row address WEAK_ADDR). The weak cell row address WEAK_ADDR may be stored in the address storing unit 760 before or after the memory system 700 is packaged.

The weak cell row address WEAK_ADDR is transmitted to the address comparing unit 720 from the address storing unit 760 during a power-up sequence of the memory system 700. The memory controller 710 may include an address storing unit 760' (not shown) to receive and store the addresses WEAK_ADDR transmitted from the address storing unit 760 of the memory device 750 (WEAK_ADDR in FIG. 22). This may be done during a power-up sequence of the memory system 700. The address storing unit 760' may be within the address comparing unit block 720 in FIG. 22. The address comparing unit 720 compares the weak cell row address WEAK_ADDR (e.g., stored in address comparing unit 720) with the write row address ROW_ADDR for accessing memory cell rows of the volatile memory device 750 to provide a match signal MATCH to the multiplexer 730 based on the comparison (e.g., in a manner as described with respect to address storing unit 225a and address comparison unit 300a in FIG. 6). In alternative embodiments, the address storing unit 760' may be a non-volatile memory and be programmed with the WEAK_ADDR corresponding to weak addresses of one or more memory devices 750 (e.g., after testing a memory system 700 during manufacturing). In these alternatives, address storing unit(s) 760 of the memory device(s) 750 may be unnecessary. When the weak cell row address WEAK_ADDR does not match with the write row address ROW_ADDR, the match signal MATCH has a first logic level. When the match signal MATCH has a first logic level, the multiplexer 730 selects a first write recovery time WR1 to be provided to the transaction processor 740. The transaction processor 740 receives the first write recovery time tWR1 and provides a command or transaction TRANS to the volatile memory device 750 such that normal cell rows other than the weak cell row are operated using the first write recovery time tWR1 (e.g., are written to using the first write recover time WR1).

When the weak cell row address WEAK_ADDR matches with the write row address ROW_ADDR, the match signal MATCH has a second logic level. When the match signal MATCH has a second logic level, the multiplexer 730 selects a second write recovery time tWR2 to be provided to the transaction processor 740. The transaction processor 740 receives the second write recovery time tWR1 provides a command or transaction TRANS to the volatile memory device 750 such that the weak cell row has the second write recovery time tWR2.

The first write recovery time tWR1 is a write recovery time for memory cell rows defined in a specification of the volatile memory device 750. For example, the first write recovery time tWR1 may be 15 nsec in DDR3 SDRAM. The second write recovery time tWR2 may be as twice as the first write recovery time tWR1. In this example, the actual write recovery time values need not be provided to the transaction processor 740 nor to the memory device 750. Rather, mode indicators and/or commands corresponding to the different write recovery times may be used.

Figure 23:
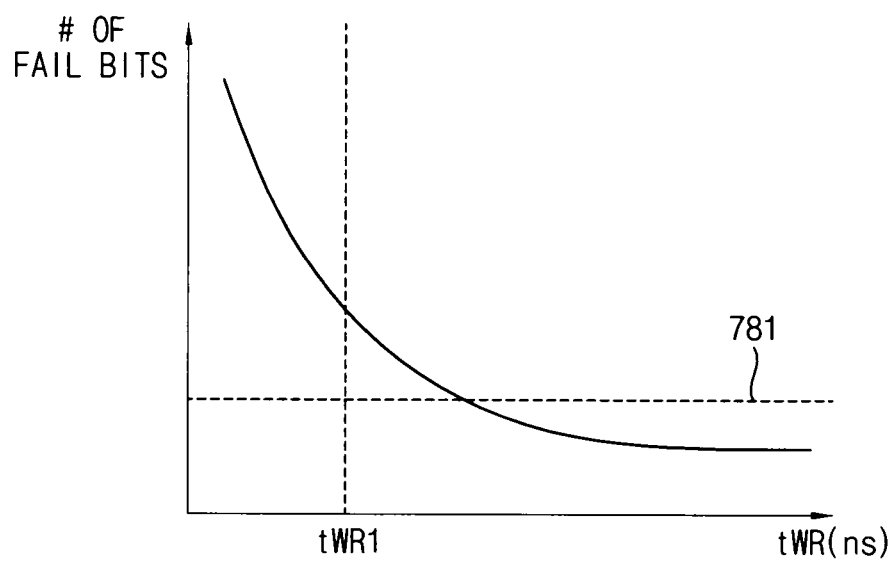
FIG. 23 is a graph illustrating a relationship between a write recovery time and a number of fail bits in volatile memory devices.

FIG. 23 is a graph illustrating a relationship between a write recovery time and a number of fail bits in volatile memory devices.

Referring to FIG. 23, it is noted that the number of fail bits decreases as the write recovery time tWR increases. In FIG. 23, a reference numeral 781 represents the number of fail bits that can be recovered.

Figure 24:
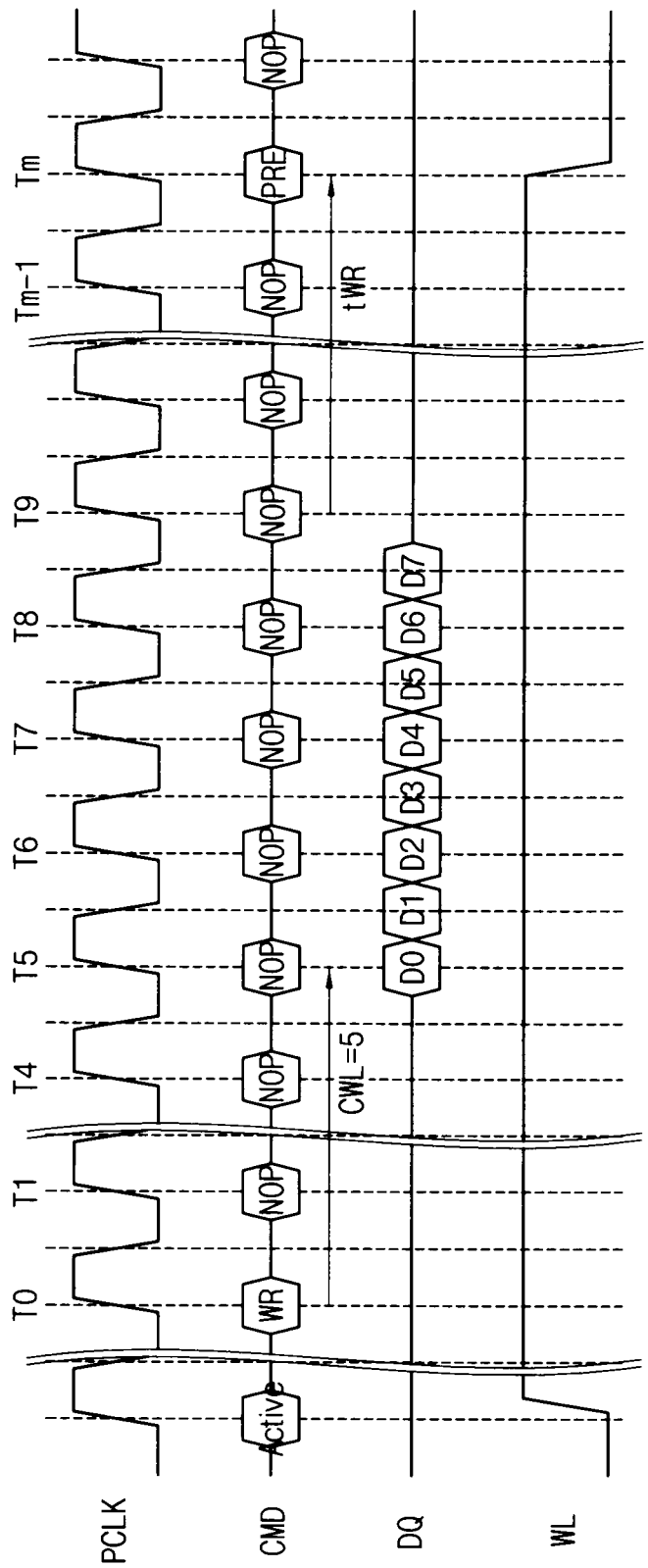
FIG. 24 is a timing diagram for explaining write performance of memory cells in a volatile memory device.

FIG. 24 is a timing diagram for explaining write performance of memory cells in a volatile memory device.

In FIG. 24, it is assumed that clock write latency CWL is 5 clocks and burst length is 8 clocks in DDR3 SDRAM.

Referring to FIG. 24, wordline WL is enabled in response to active command ACT, write command WR is receives at clock T0, data D0~D7 are written at clocks T5~t8 after clocks T1~T4 and the wordline WL is disabled in response to precharge command PRE at clock Tm after clocks T9~Tm−1. In FIG. 24, a write recovery time tWR corresponds to an interval of clocks T9~Tm. As is shown in FIG. 24, since the wordline WL is right after the data D7 is received, the data D0~D7 may not have enough time to be written when the row is a weak cell row. Therefore, write performance and memory retention may be poor or erroneous. The weak cell may be a memory cell whose write performance and or data retention capability is worse than other cells, and the weak cell row is a memory cell row including at least one weak cell.

Figure 25:
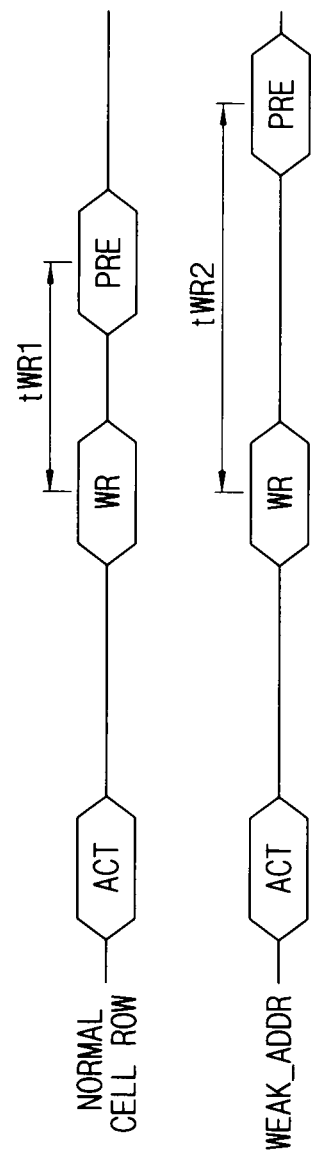
FIG. 25 is a diagram for explaining operation of the memory system of FIG. 22.

FIG. 25 is a diagram for explaining operation of the memory system of FIG. 22.

Referring to FIG. 25, as for normal cell rows, a wordline is enabled in response to active command ACT and write operation is performed in response to write command WR. The wordline is disabled in response to precharge command PRE after a first write recovery time tWR1 from a point where the write command WR is asserted. As for the weak cell row, the wordline of the weak cell row is enabled in response to the active command ACT and write operation is performed in response to write command WR. The wordline is disabled in response to the precharge command PRE after a second write recovery time tWR2 longer than the first write recovery time tWR1 from a point where the write command WR is asserted. The second write recovery time tWR2 may be differentiated with the first write recovery time tWR1 based on the use of different commands sent from a memory controller. Alternatively, the memory device may recognize a command received corresponds to a command to write to a weak memory cell row, and increase the write recovery time to tWR2 to compensate for the weak cell row. The memory device may recognize the command received corresponds to the command to write to a weak memory cell row in a manner described with respect to other embodiments (including those embodiments related to refreshing a weak memory cell row).

As described with reference to FIGS. 21 through 25, the write performance of the weak cell row may be enhanced by differentiate the write recovery times (or the time windows) of the normal cell row and the weak cell row based on comparison of the write row address and weak cell row address.

Figure 26:
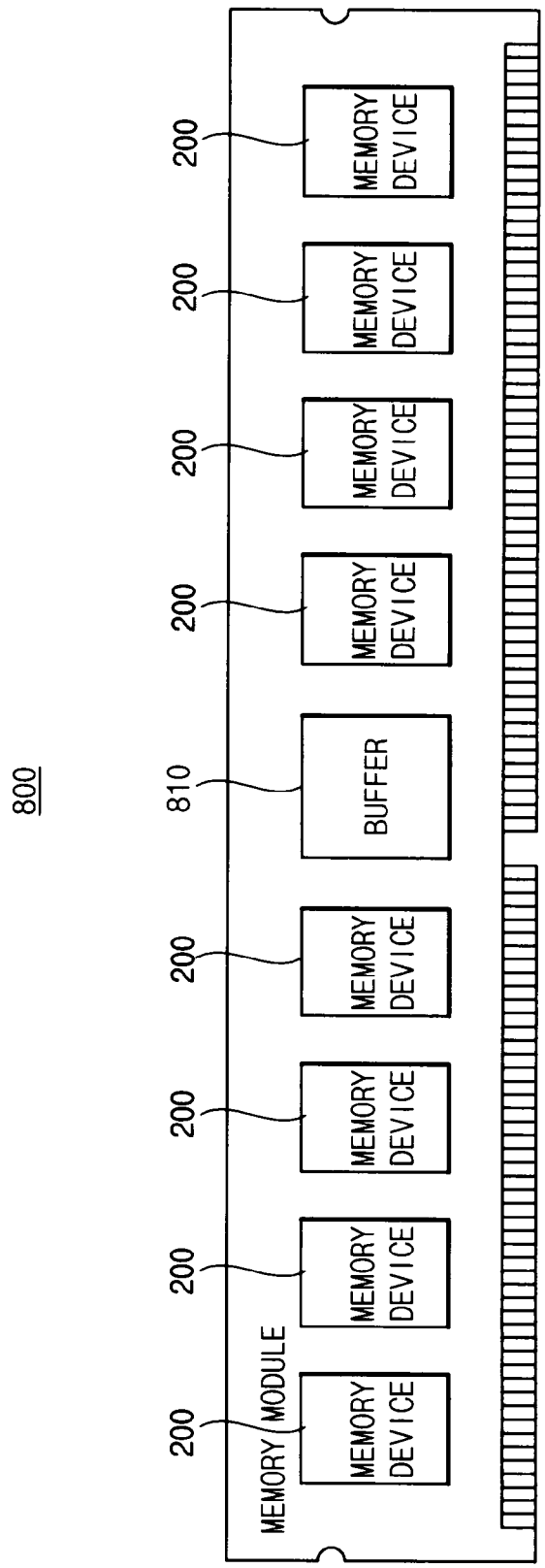
FIG. 26 is a block diagram illustrating a memory module according to some exemplary embodiments.

FIG. 26 is a block diagram illustrating a memory module according to some exemplary embodiments.

Referring to FIG. 26, a memory module 800 may include a plurality of volatile memory devices 200. In some embodiments, the memory module 800 may be an unbuffered dual in-line memory module (UDIMM), a registered dual in-line memory module (RDIMM), a fully buffered dual in-line memory module (FBDIMM), a load reduced dual in-line memory module LRDIMM, etc.

The memory module 800 may further a buffer 810 that provides a command/address signal and data by buffering the command/address signal and the data from a memory controller through a plurality of transmission lines. In some embodiments, data transmission lines between the buffer 800 and the volatile memory devices 200 may be coupled in a point-to-point topology, and command/address transmission lines between the buffer 810 and the volatile memory devices 200 may be coupled in a multi-drop topology, a daisy-chain topology, a fly-by daisy-chain topology, or the like. Since the buffer 1200 buffers both the command/address signal and the data, the memory controller may interface with the memory module 1200 by driving only a load of the buffer 810. Accordingly, the memory module 800 may include more volatile memory devices and/or more memory ranks, and a memory system may include more memory modules.

The volatile memory devices 200 may enhance write performance of the weak cell row by controlling the refresh of the weak cell row (selectively refreshing the weak cell row) based on whether the weak cell row address matches with the refresh row address.

Figure 27:
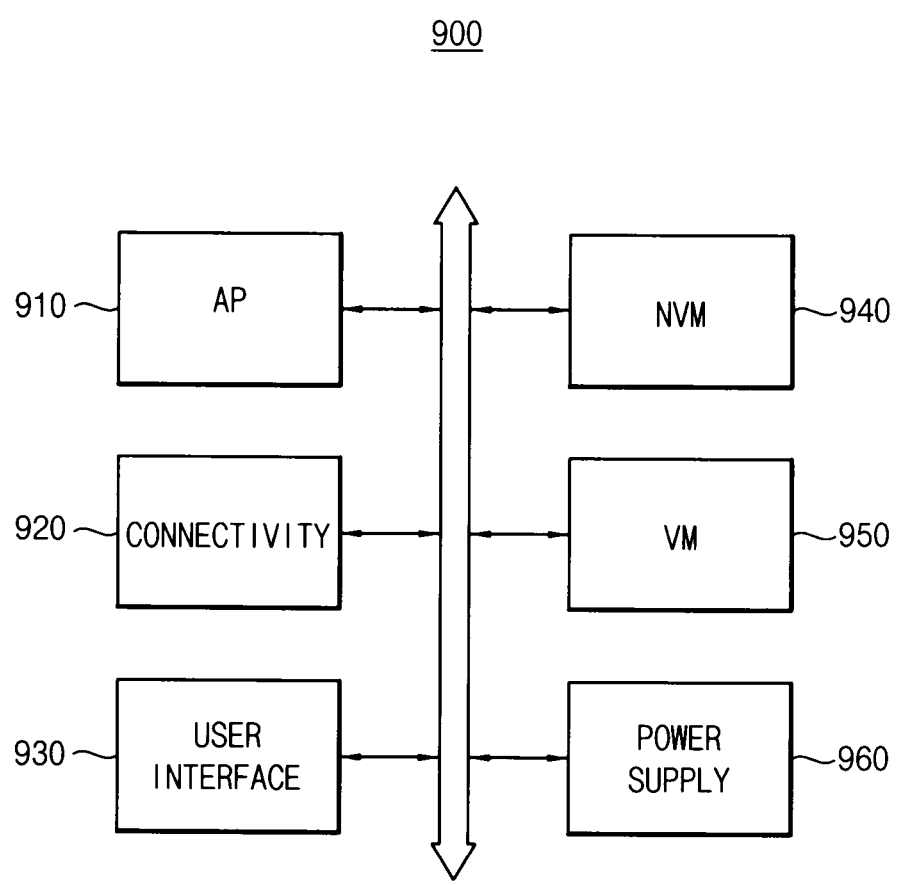
FIG. 27 is a block diagram illustrating a mobile system according to some exemplary embodiments.

FIG. 27 is a block diagram illustrating a mobile system according to some exemplary embodiments.

Referring to FIG. 27, a mobile system 900 includes an application processor 910, a connectivity unit 920, a volatile memory device 950, a nonvolatile memory device 940, a user interface 930 and a power supply 960. In some embodiments, the mobile system 900 may be a mobile phone, a smart phone, a personal digital assistant (PDA), a portable multimedia player (PMP), a digital camera, a music player, a portable game console, a navigation system, etc.

The application processor 910 may execute applications, such as a web browser, a game application, a video player, etc. In some embodiments, the application processor 910 may include a single core or multiple cores. For example, the application processor 910 may be a multi-core processor, such as a dual-core processor, a quad-core processor, a hexa-core processor, etc. The application processor 910 may include an internal or external cache memory.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. In some embodiments, connectivity unit 920 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 950 may store data processed by the application processor 910, or may operate as a working memory. For example, the volatile memory device 950 may be a dynamic random access memory, such as DDR SDRAM, LPDDR SDRAM, GDDR SDRAM, RDRAM, etc., or may be any volatile memory device that requires a refresh operation. The volatile memory device 950 may enhance write performance of the weak cell row by controlling the refresh of the weak cell row (selectively refreshing the weak cell row) based on whether the weak cell row address matches with the refresh row address.

The nonvolatile memory device 940 may store a boot image for booting the mobile system 900. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 930 may include at least one input device, such as a keypad, a touch screen, etc., and at least one output device, such as a speaker, a display device, etc. The power supply 960 may supply a power supply voltage to the mobile system 900. In some embodiments, the mobile system 900 may further include a camera image processor (CIS), and/or a storage device, such as a memory card, a solid state drive (SSD), a hard disk drive (HDD), a CD-ROM, etc.

In some embodiments, the mobile system 900 and/or components of the mobile system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 28:
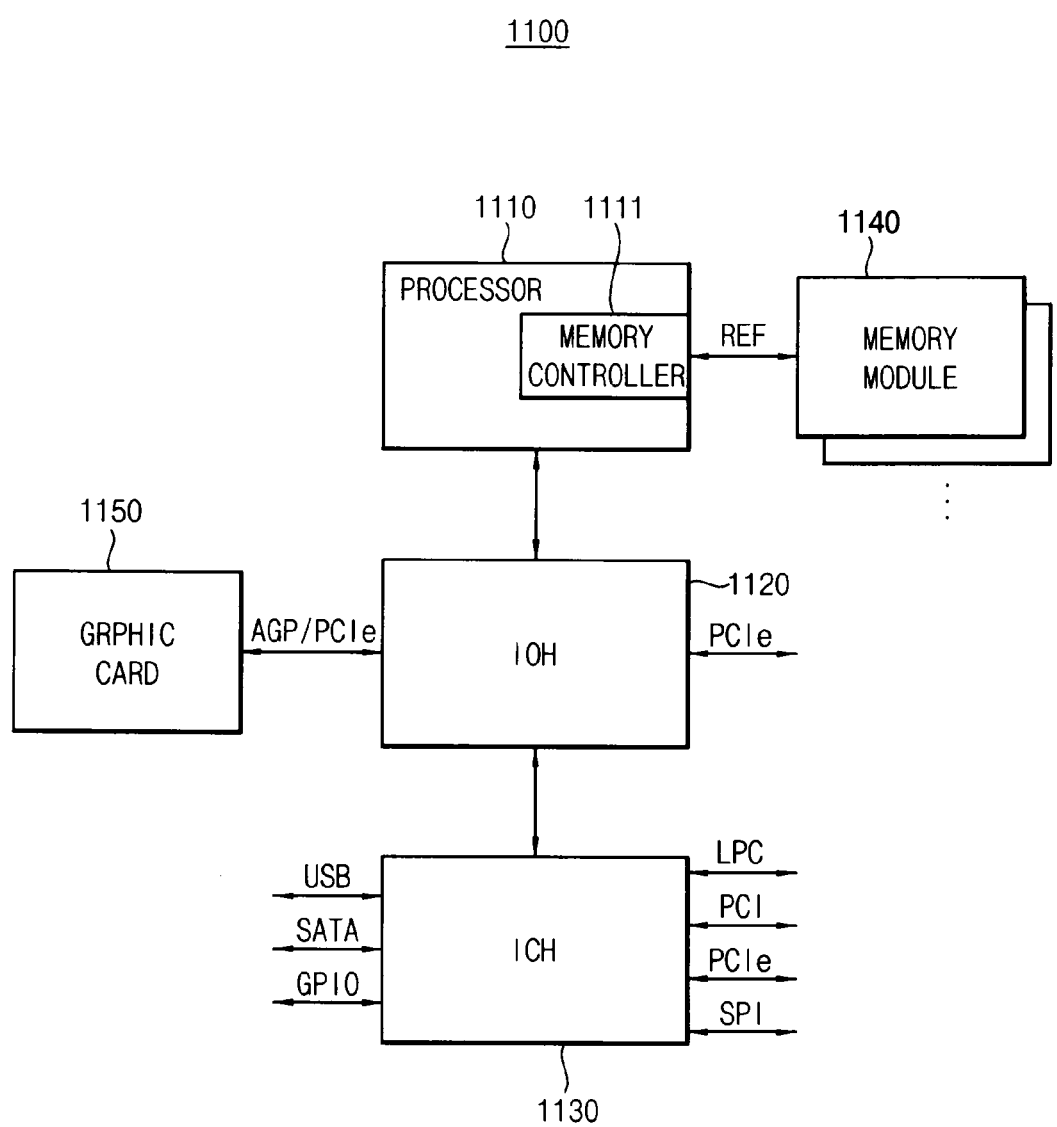
FIG. 28 is a block diagram illustrating a computing system according to some exemplary embodiments.

FIG. 28 is a block diagram illustrating a computing system according to some exemplary embodiments.

Referring to FIG. 28, a computing system 1100 includes a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 28 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). The memory controller 1111 may include structure and/or perform the methods of one or more of the embodiments described herein. A memory interface between the memory controller 1111 and the memory module 1140 may be implemented with a single channel including a plurality of signal lines, or may bay be implemented with multiple channels, to each of which at least one memory module 1140 may be coupled. In some embodiments, the memory controller 1111 may be located inside the input/output hub 1120, which may be referred to as memory controller hub (MCH).

The memory module 1140 may include a plurality of volatile memory devices that store data provided from the memory controller 1111. The volatile memory devices may enhance write performance of the weak cell row by controlling the refresh of the weak cell row (selectively refreshing the weak cell row) based on whether the weak cell row address matches with the refresh row address. As an alternative and/or in addition, the memory controller may treat groups of memory cell rows as weak cell row groups rather than on an individual weak cell row basis. For example, a bank of one of the memory chips of one of the memory modules may be considered a weak cell bank and have quicker refresh cycles and/or longer write times (e.g., longer write recovery times) than other banks of that memory chip and/or other banks of memory chips.

The input/output hub 1120 may manage data transfer between processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 40 illustrates the computing system 1100 including one input/output hub 1120, in some embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal memory device. In some embodiments, the input/output hub 1120 may include an internal graphics device along with or instead of the graphics card 1150 outside the graphics card 1150. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

The present inventive concept may be applied to any volatile memory device that requires a refresh operation and to a system including the volatile memory device. The concepts may also be applied to non-volatile memory devices. For example, read disturbance errors in a non-volatile memory device may be more prevalent in certain rows of memory requiring quicker copy-back cycle times, which may be performed/implemented in a manner similar to the altered refresh cycle time embodiments described herein. In addition, non-volatile memory devices may have memory cell rows requiring longer write times and may be provided with a longer write recovery time than normal cell rows, which may be performed/implemented in a manner similar to altered write recovery time embodiments described herein. The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A memory device, comprising:
a memory cell array, including a plurality of rows of volatile memory cells, the plurality of rows including weak cell rows and normal cell rows;
a command decoder configured to receive commands;
an address table storing a plurality of weak cell row addresses identifying corresponding weak cell rows;
a refresh control circuit configured to control operation of the memory cell array to periodically refresh the plurality of rows of volatile memory cells, wherein the refresh control circuit is configured to cause a refresh operation of a first weak cell row in response to the command decoder receiving a write command to write to the first weak cell row when the first weak cell row is identified by a weak cell row address stored in the address table.

2. The memory device of claim 1, wherein the refresh control circuit is configured to monitor a sequence of refresh operations during a first time period after receiving the write command to write to the first weak cell row.

3. The memory device of claim 2, wherein the refresh control circuit is configured to add a refresh operation to the sequence of refresh operations upon a determination that the first weak cell row has not been refreshed within a first period of time.

4. The memory device of claim 3, wherein the refresh control circuit is configured to refresh normal cell rows with a refresh period of a second period of time, the second period of time being greater than the first period of time.

5. The memory device of claim 1, wherein the refresh control circuit is configured to replace a scheduled refresh operation of a first second row with a refresh operation of the first weak cell row.

6. The memory device of claim 5, wherein the refresh control circuit is configured to cause a refresh operation of the first second row immediately after the refresh operation of the first weak cell row.

7. The memory device of claim 1, wherein the refresh control circuit is configured to cause a refresh operation of the first weak cell row to occur at the same time as the refresh operation of a first second row.

8. The memory device of claim 1, wherein the refresh control circuit is configured to analyze a refresh schedule to determine if the refresh schedule includes a refresh operation of the first weak cell row within predetermined time.

9. A memory device comprising:
a memory cell array, including a plurality of rows of volatile memory cells, the plurality of rows including weak cell rows and normal cell rows;
a command decoder configured to receive a first write command to indicate a first write operation with a first time window and to receive a second write command to indicate a second write operation with a second time window, the first write command and the second write command comprising different command codes the first write command and the second write command being received from a source external to the memory device; and a row decoder configured to perform the first write operation to a weak cell row with the first time window and to perform the second write operation to a normal cell row with the second time window, the second time window being less than the first time window.

10. The memory device of claim 9, wherein the command decoder is configured to receive with each of the first and second write commands, a respective address identifying a row to be written to and a respective code identifying a write time to be used in writing to the identified row.

11. The memory device of claim 9, wherein the memory cell array further comprises:
an address table storing a plurality of weak cell row addresses identifying corresponding weak cell rows.

12. The memory device of claim 11, wherein the memory device is configured to transmit the weak cell row addresses to the memory controller.

13. A memory controller comprising:
a control circuit configured to generate commands to be sent to a memory device, the commands including a write command and a refresh command;
a table storing a plurality of weak cell row addresses of the memory device; and
an address comparing unit configured to determine if a first address associated with a first write command to be sent to the memory device corresponds to one of the plurality of weak cell row addresses;
wherein the control circuit is responsive to the address comparing unit to schedule a refresh command associated with the first address in response to the determination of the address comparing unit.

14. The memory controller of claim 13, wherein the memory controller is configured to receive the plurality of weak cell row addresses from the memory device and to store the received plurality of weak cell row addresses in the table.

15. The memory controller of claim 13, wherein
the control circuit is configured to generate a first refresh command to refresh a first cell row corresponding to the first address, the first cell row being refreshed within a first time period after a write operation to the first cell row.

16. The memory controller of claim 15, wherein the control circuit is configured to generate at least one second refresh command to refresh second cell rows within a second time period, the second time period being greater than the first time period.

17. The memory controller of claim 13, wherein the controller is responsive to the address comparing unit to generate a first write command for a weak cell row address stored in the table and a second write command for a normal cell row not identified by the table.

18. The memory controller of claim 17, wherein the first write command causes the memory device to perform a write operation for a first time period, and the second write command causes the memory device to perform a write operation for a second time period, the second time period being less than the first time period.

19. The memory controller of claim 18, wherein a command code of the first write command is different from a command code of the second write command.

20. The memory controller of claim 18, wherein control circuit is configured to generate the first write command with a first time indicator and to generate the second write command with a second time indicator, wherein the memory device is responsive to the first and second time indicators to respectively cause write operations for the first time period and the second time period.

21. A memory system, comprising the memory device of claim 1 and a memory controller in communication with the memory device and configured to issue commands to the memory device.

* * * * *